(12) United States Patent
Frost et al.

(10) Patent No.: US 6,625,835 B1
(45) Date of Patent: *Sep. 30, 2003

(54) DISK CASCADE SCRUBBER

(75) Inventors: David T. Frost, San Jose, CA (US); Oliver David Jones, Watsonville, CA (US); Scott Petersen, Scotts Valley, CA (US); Donald Stephens, Santa Cruz, CA (US); Anthony Jones, Ben Lomond, CA (US); Bryan Riley, San Jose, CA (US)

(73) Assignees: Lam Research Corporation, Fremont, CA (US); Oliver Design, Inc., Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/580,827

(22) Filed: May 26, 2000

Related U.S. Application Data

(60) Provisional application No. 60/136,635, filed on May 27, 1999, and provisional application No. 60/154,970, filed on Sep. 20, 1999.

(51) Int. Cl.[7] ................................................. B08B 1/02
(52) U.S. Cl. ............................ 15/77; 15/88.3; 134/902; 198/733; 198/734; 414/935; 451/336
(58) Field of Search ........................... 15/77, 88.3, 102, 15/3.13, 3.16; 134/902; 198/733, 734; 414/935; 451/336

(56) References Cited

U.S. PATENT DOCUMENTS

| | | | | |
|---|---|---|---|---|
| 1,513,195 A | * | 10/1924 | Stevens | 15/3.16 |
| 2,603,039 A | * | 7/1952 | Slocum et al. | 451/336 X |
| 2,880,432 A | * | 5/1959 | Schnider et al. | 15/3.16 |
| 3,449,779 A | * | 6/1969 | Butterworth | 15/3.16 |
| 4,109,337 A | | 8/1978 | Hillman et al. | 15/77 X |
| 4,750,229 A | * | 6/1988 | Poel et al. | 198/734 X |
| 5,893,381 A | | 4/1999 | Terui | 15/77 X |
| 6,269,511 B1 | * | 8/2001 | Andreas et al. | 15/77 |

FOREIGN PATENT DOCUMENTS

| | | |
|---|---|---|
| EP | 0718871 | 6/1996 |
| WO | 9904416 | 1/1999 |

OTHER PUBLICATIONS

Dave Frost and Yassin Mehmandoust, Precision Cleaning Process & Equipment Technology Enabling Continuous Cost Reduction for HDD Media Manufacturers, Apr. 2000, Data Tech, 4th Edition, Spring 2000, pp 51–55.

* cited by examiner

*Primary Examiner*—Mark Spisich
(74) *Attorney, Agent, or Firm*—Martine & Penilla, LLP

(57) ABSTRACT

A cascaded disk scrubbing system and method are provided. The cascaded disk scrubbing system includes an array of rows of brush pairs. Each row includes a plurality of counter-rotating brush pairs that are arranged horizontally and longitudinally, and configured to receive and process a disk in a vertical orientation through disk preparation zones defined by each pair of brushes. Below and between the pairs of brushes is a track that is configured to apply a rotation to the disk and to transition the disk in a vertical orientation through the brush pairs. Nozzles dispense fluids on and over the brush pairs, and the brush pairs are configured such that fluids are dispensed through the brush pairs. Nozzles dispense a curtain of fluid between each disk preparation zone, and the cascaded disk scrubbing system is configured to progress from dirtiest to cleanest as the disk transitions through each disk preparation zone.

34 Claims, 20 Drawing Sheets

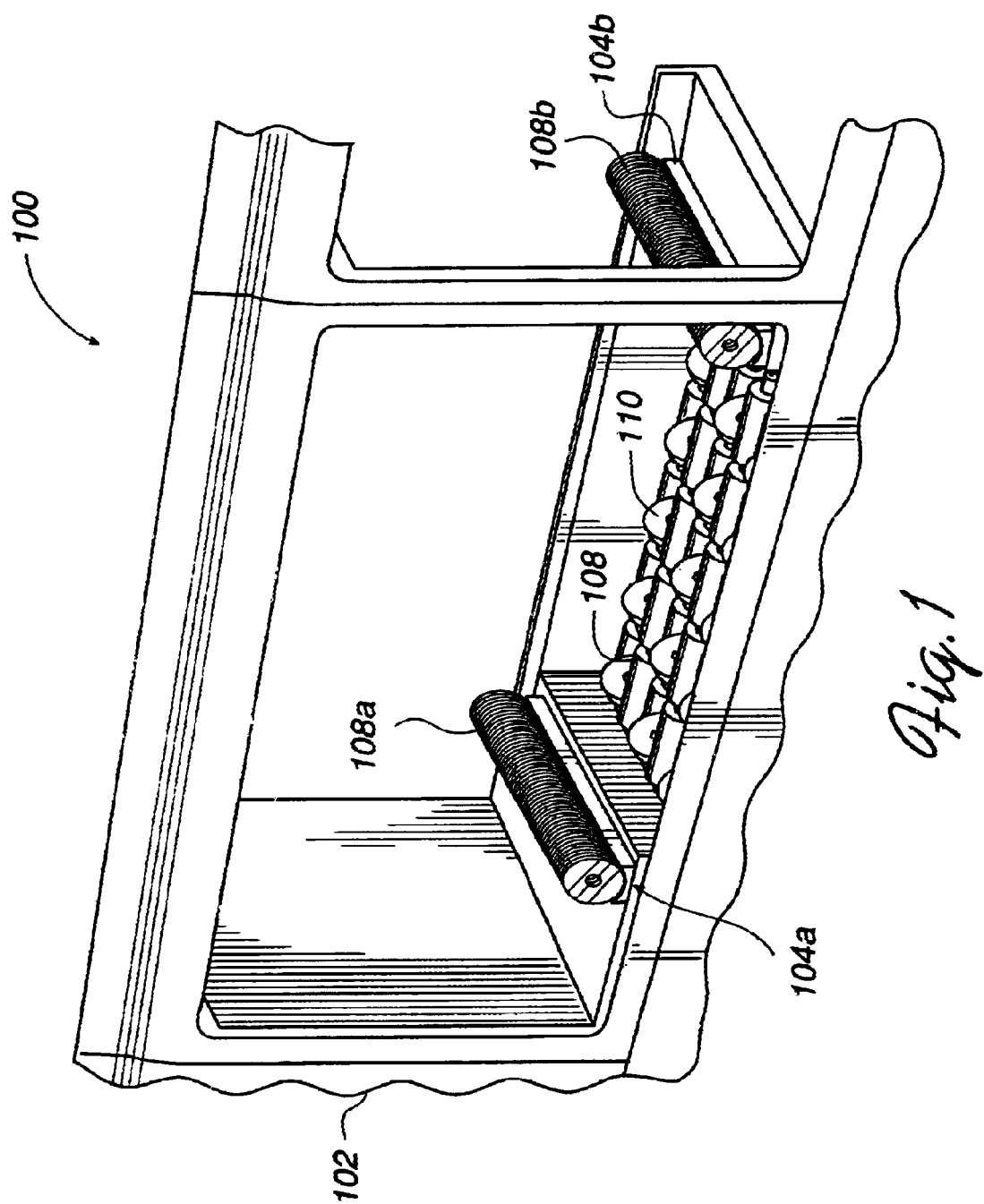

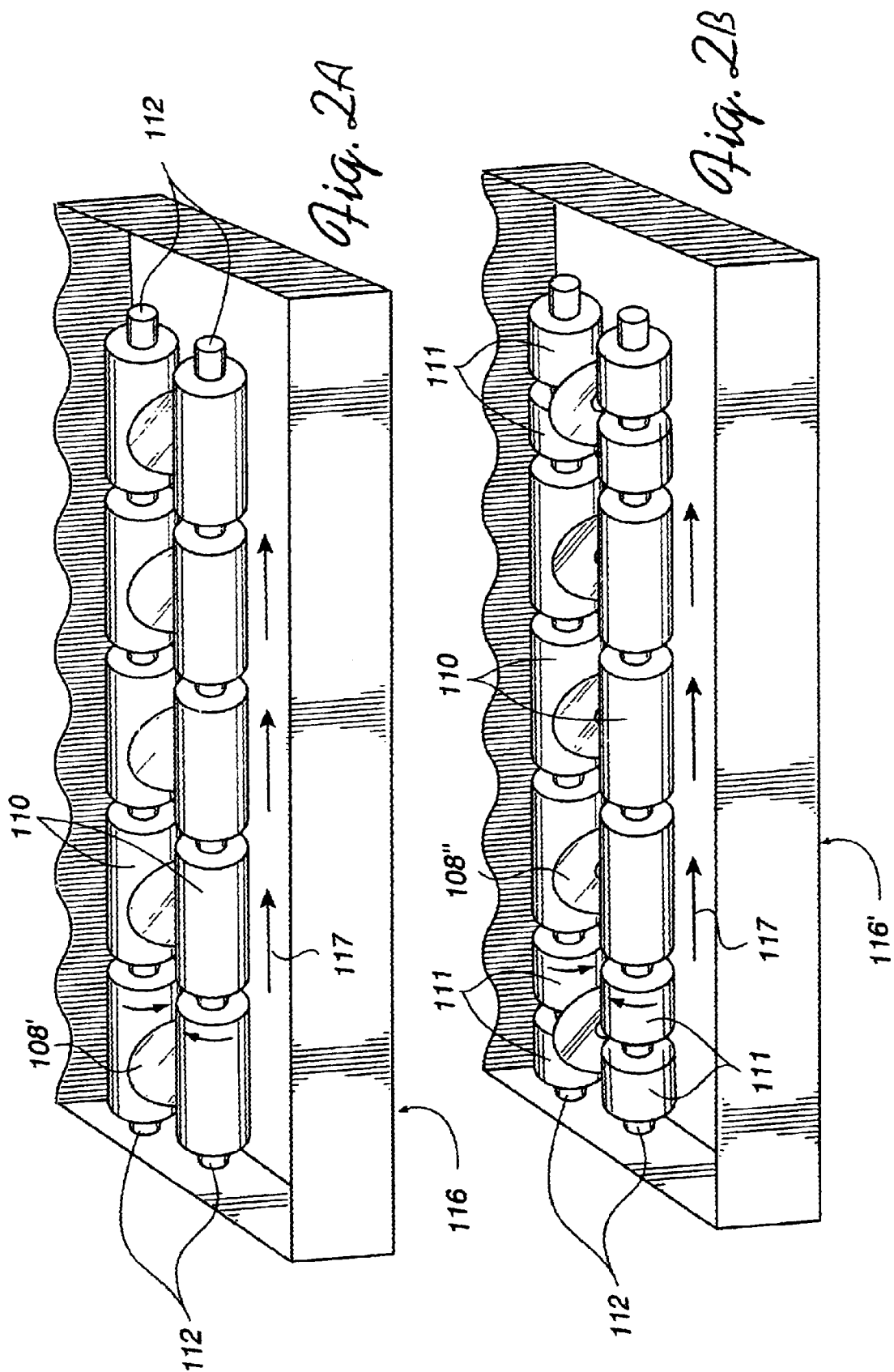

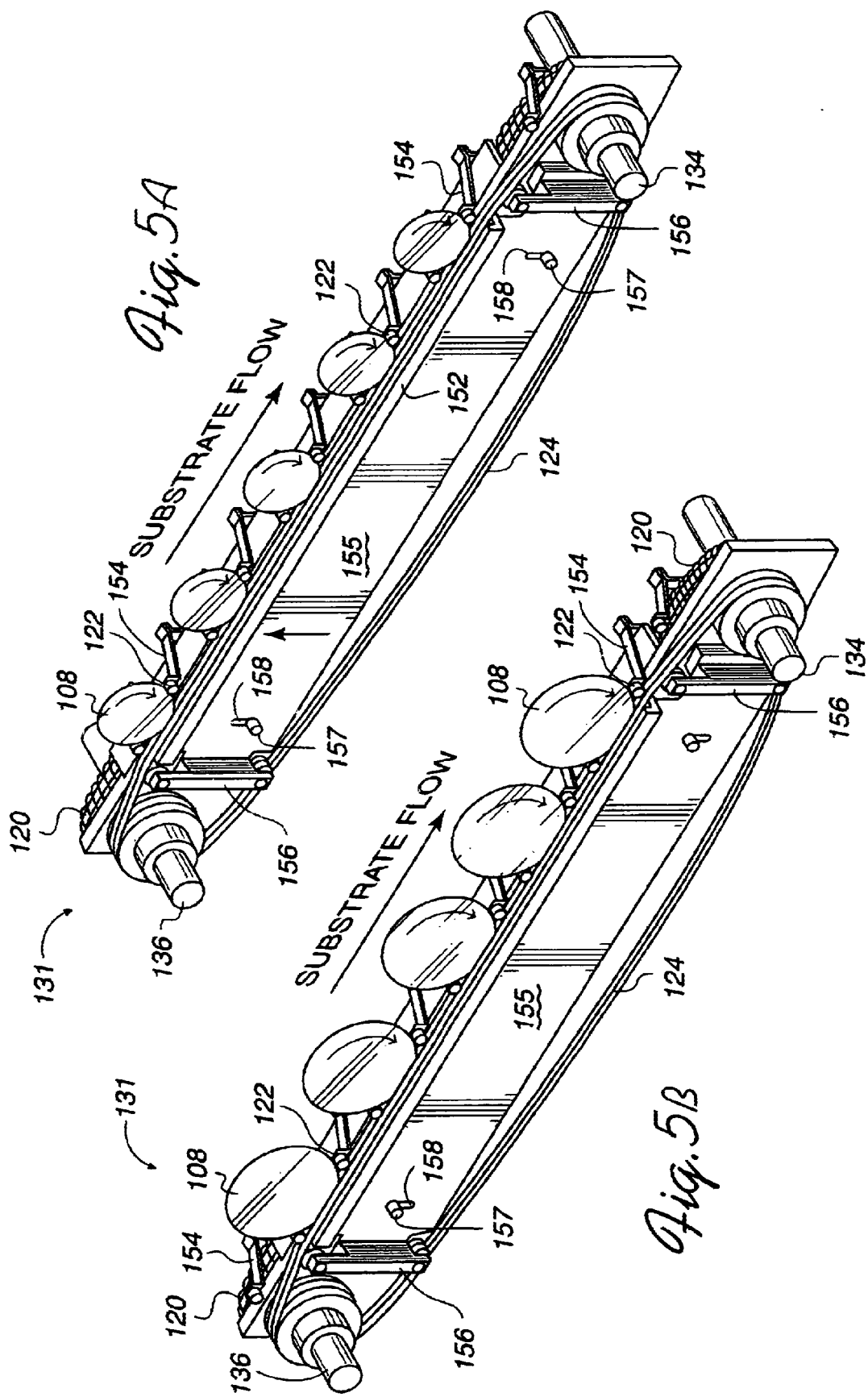

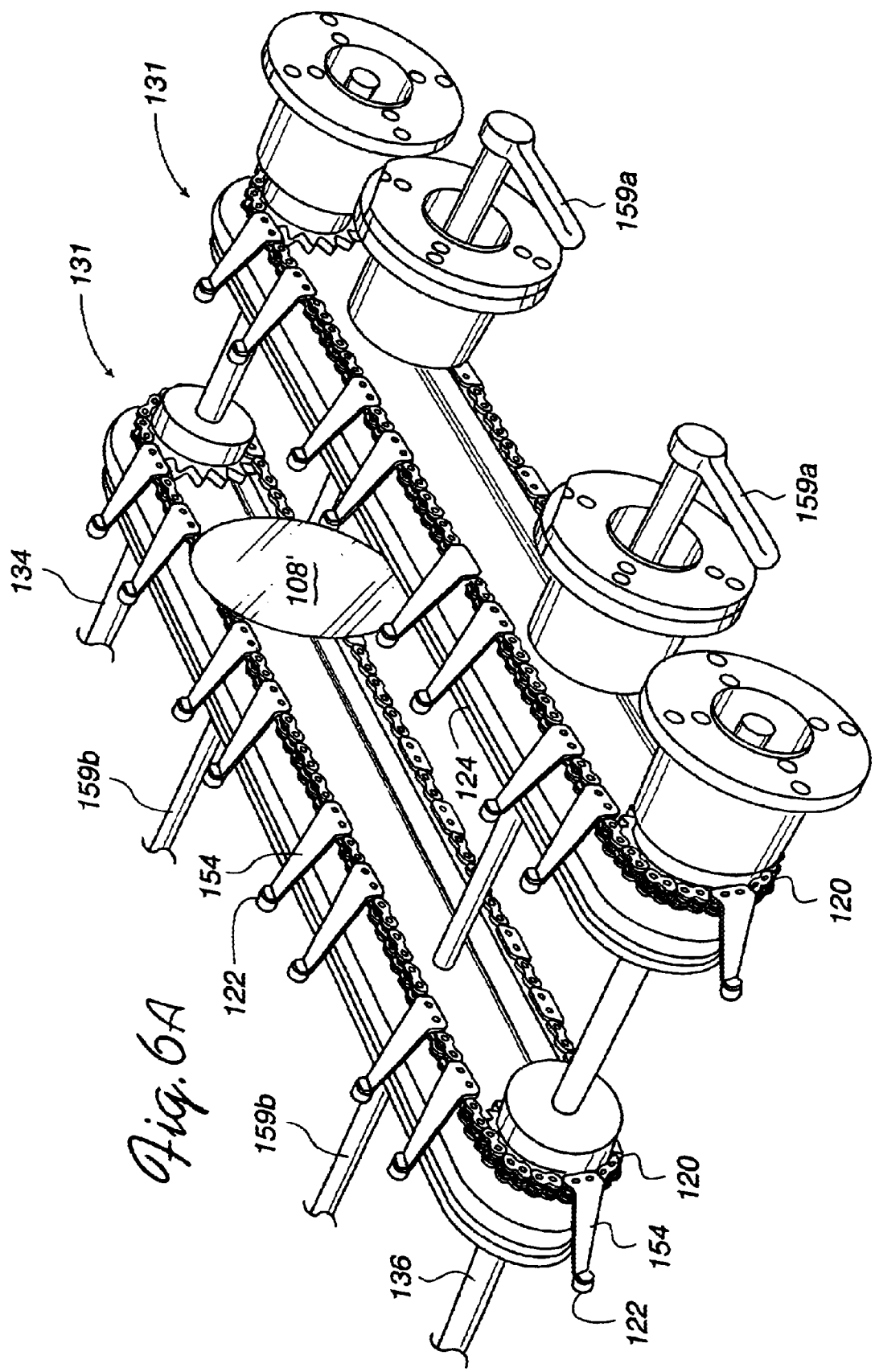

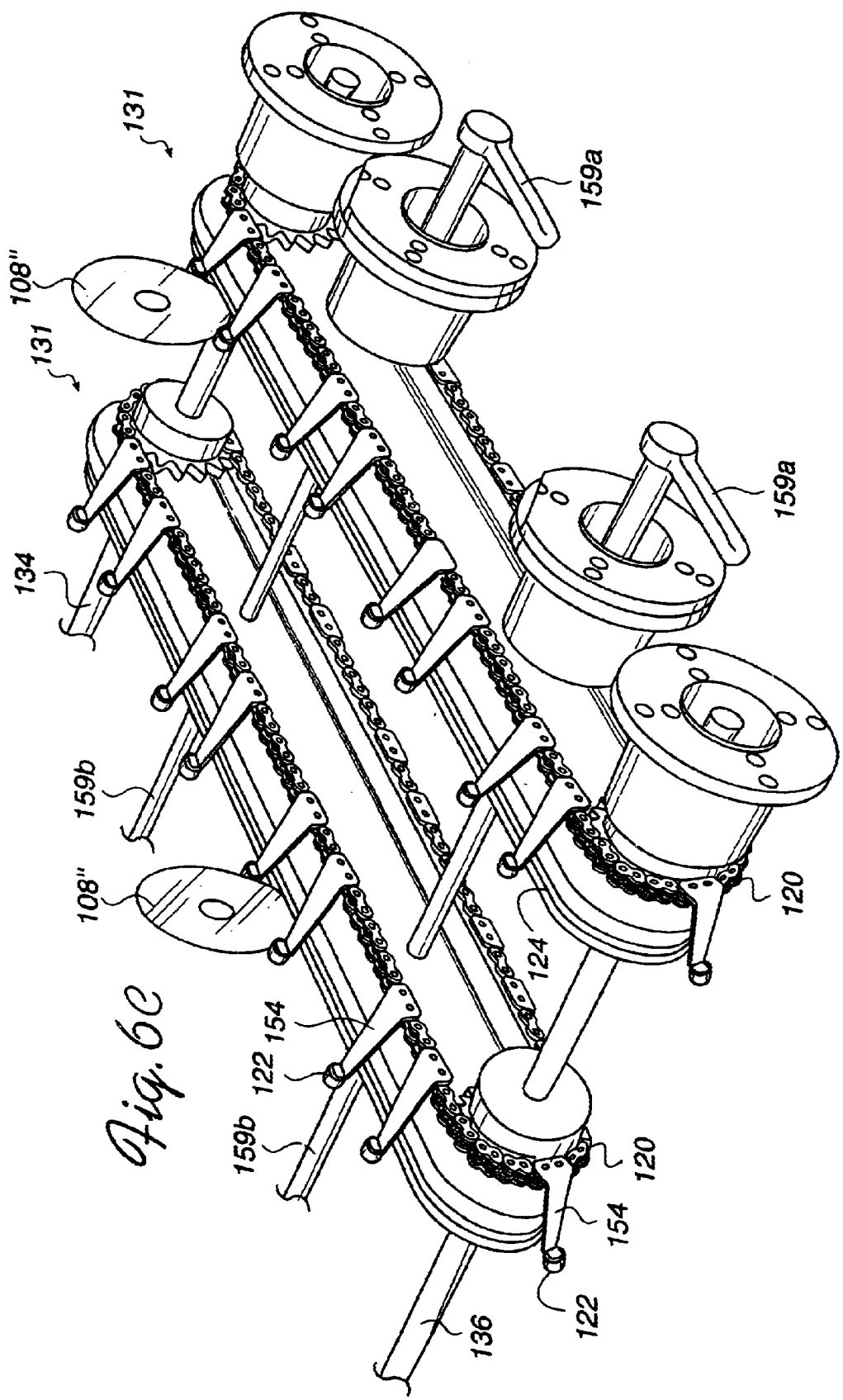

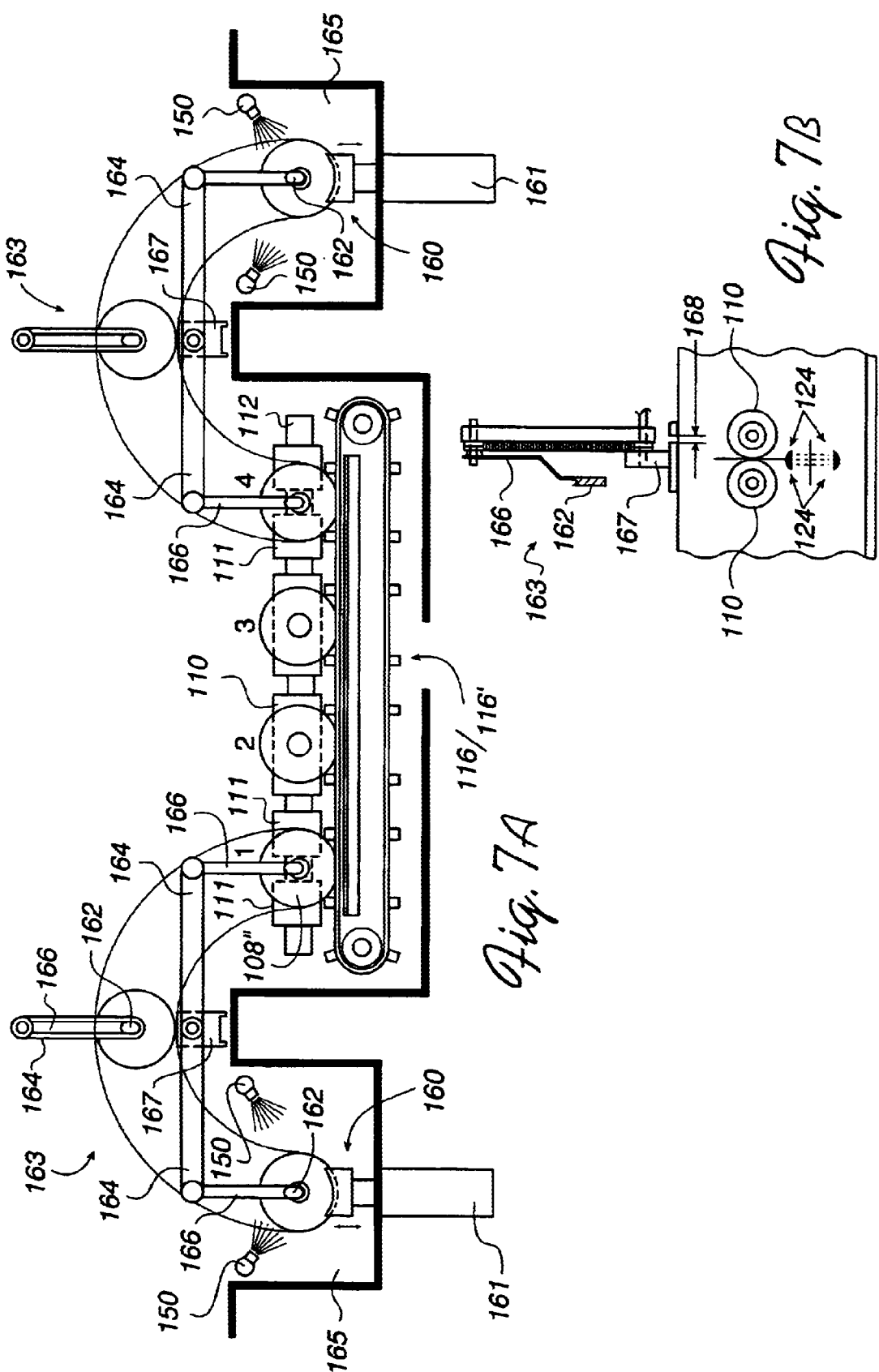

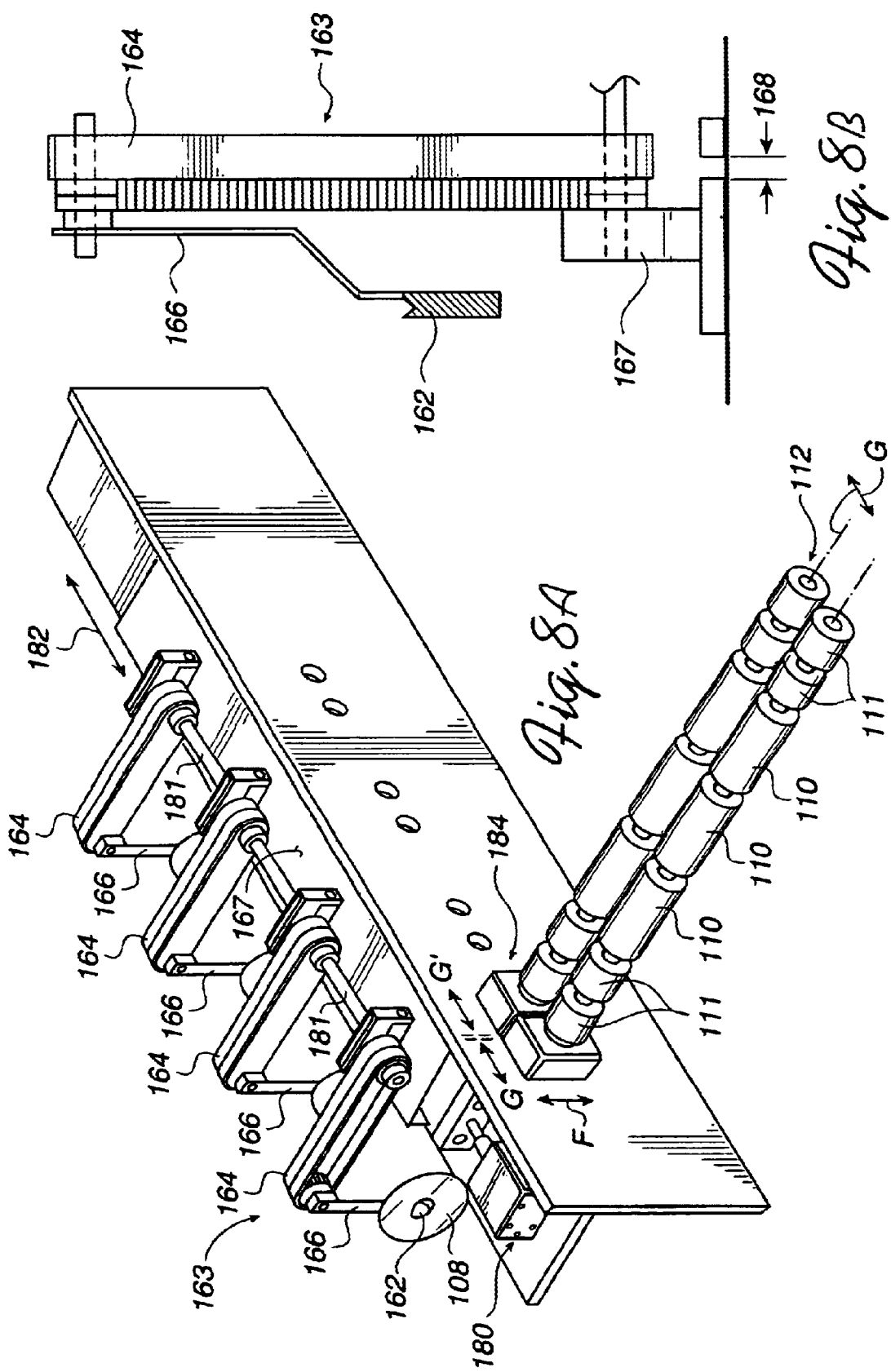

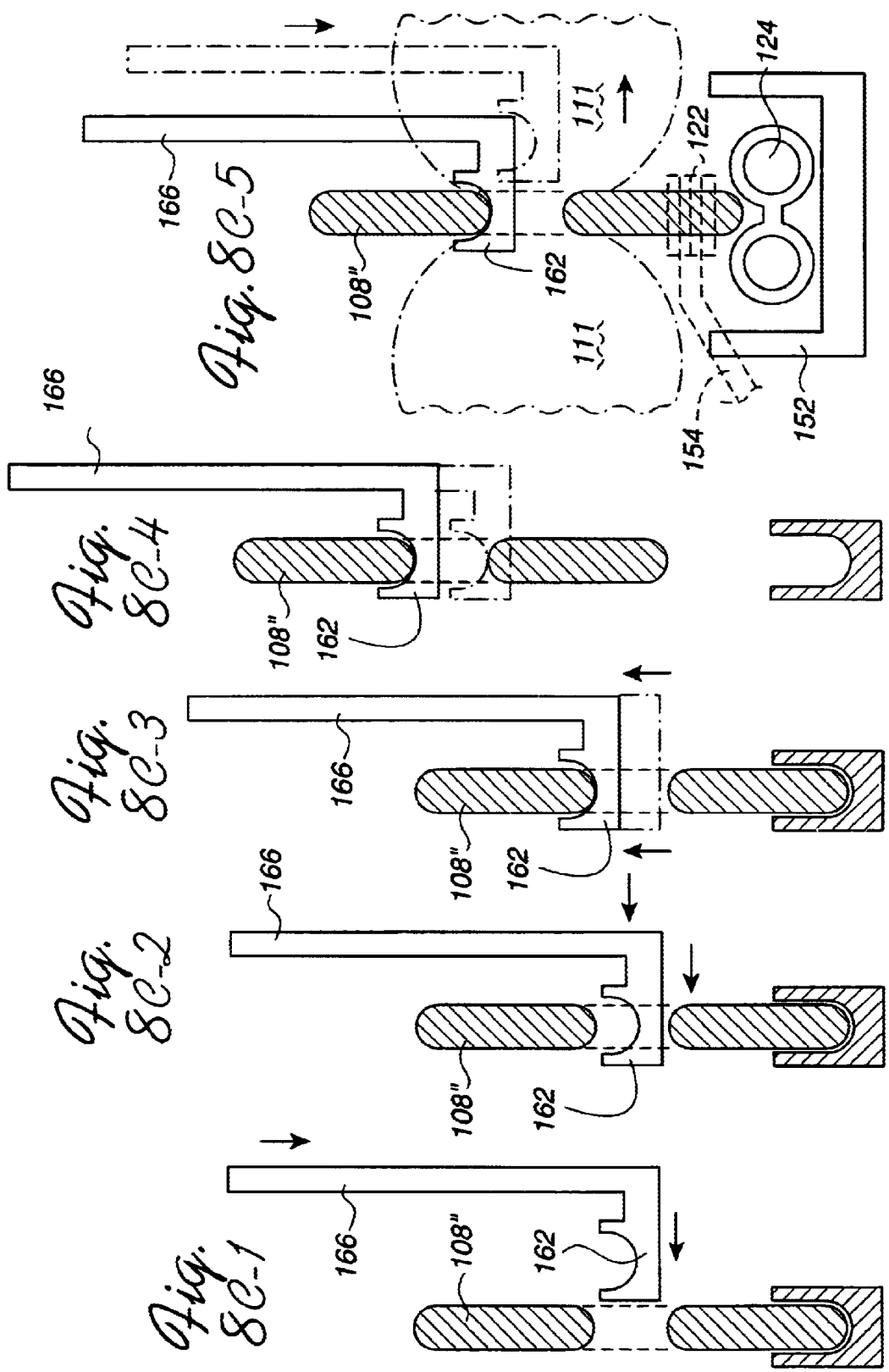

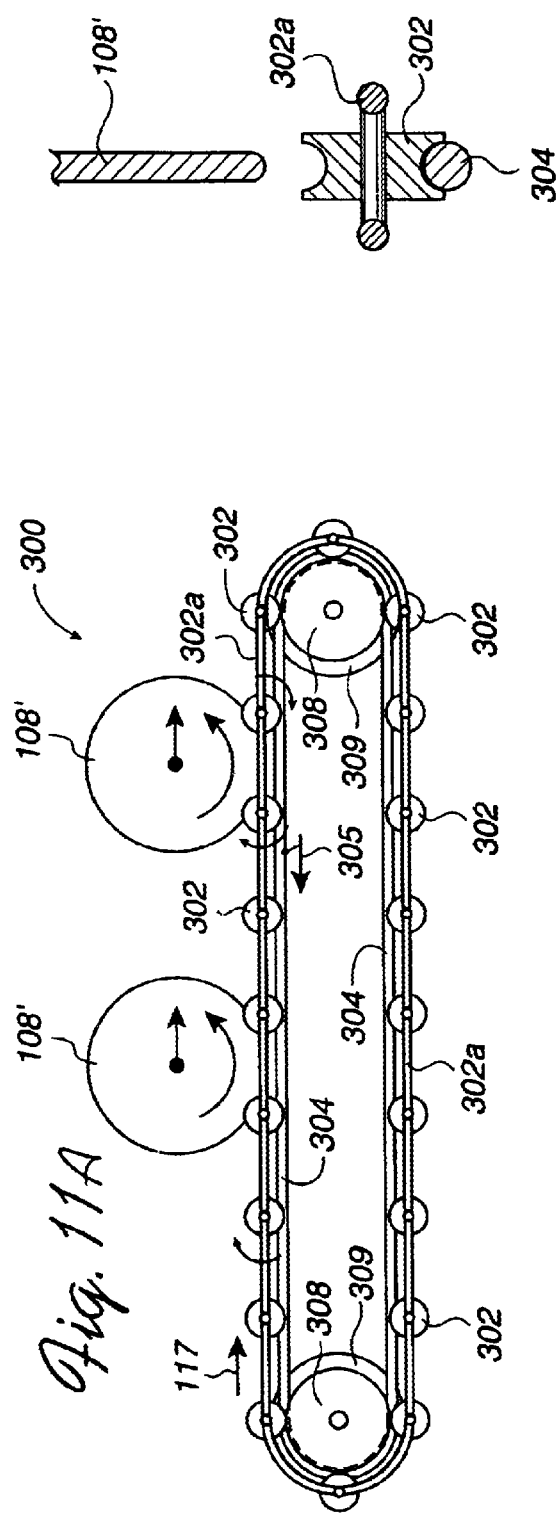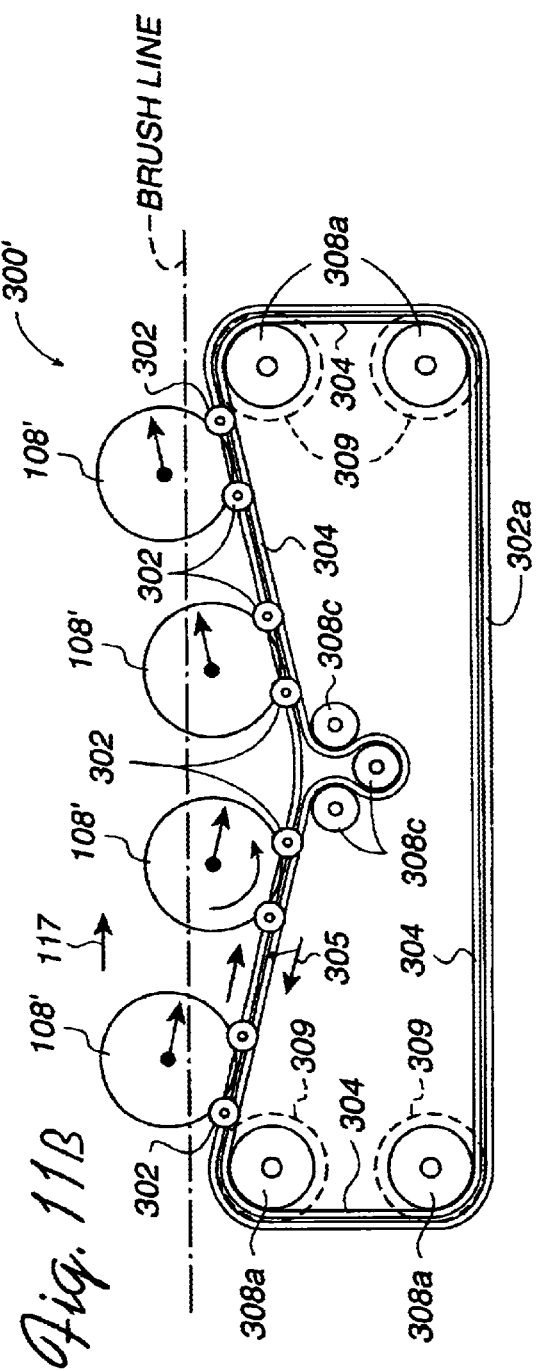

DISK CASCADE SCRUBBER

CROSS REFERENCE TO RELATED APPLICATIONS

This application claims priority from: (1) U.S. Provisional Patent Application No. 60/136,635, filed May 27, 1999, and entitled "Next Generation Modular Disk Cleaning System Including Transfer, Immersion, Cascade Brush Scrubber and Dryer Assemblies," and (2) U.S. Provisional Patent Application No. 60/154,970 filed Sep. 20, 1999, and entitled "Cascade Brush Scrubber Assembly and Substrate Transfer System." Each of these provisional applications are herein incorporated by reference.

BACKGROUND OF THE INVENTION

1. Field of the Invention

The present invention relates generally to substrate preparation systems and methods, and more particularly to apparatuses and methods for cleaning of disk-shaped substrates, including silicon wafers such as used in the fabrication of semiconductors, and aluminum, ceramic, plastic, glass and multi-component disks for data storage devices such as hard disk drives (HDD), compact discs (CD), digital video discs (DVD), and the like used in the computer, information and entertainment industries.

2. Description of the Related Art

The computer, information, and entertainment industries produce and consume countless disk-shaped substrates, principally silicon wafers, and aluminum, plastic, glass, or other multi-component disks. In the fabrication of semiconductors, silicon wafers are processed through multiple fabrication steps which can include repeated application and removal of variously conductive, non-conductive and semi-conductive materials before the resulting microcircuits are complete and separated into individual dies. Aluminum, glass, and other composite disk substrates are typically over-coated with magnetic, optical, or magneto-optical materials in the fabrication of HDDs, CDs, DVDs, and other such products.

Substrates must be buffed, polished, etched, cleaned, and otherwise prepared repeatedly during the fabrication process. This is true for both wafer and disk substrates. In the semiconductor manufacturing industry, integrated circuit devices designed of more complex, and more precise multi-layered structures require highly clean and prepared surfaces. In the field of magnetic and optical media disks, ever-increasing density translates into exacting requirements for disk cleaning and preparation. Defects resulting from improper, incomplete, or insufficient substrate buffing, polishing, cleaning, or other preparation produces decreased yield and increased time and cost.

In the prior art, substrate preparation systems and methods typically implement a one-at-a-time process. Substrates may be processed through multiple iterations of buffing, polishing, and cleaning with successive process steps being progressively cleaner. Such typically involves the transfer of substrates from one process station to another. The dwell time, or time of actual buff, polish, scrub, etc., of a single substrate, is typically 2.5–5 seconds, with an upper limit of about 10 seconds. Transfer between stations consumes another 4–15 seconds. The prior art is inefficient, time-consuming, and gradually failing to meet the increasing demands of cleanliness requirements.

In view of the foregoing, there is a need for substrate preparation systems and methods that can be applied to the operations of substrate polishing, buffing, scrubbing, cleaning and otherwise preparing the surface of both wafer and disk substrates. The substrate preparation systems and methods need to produce a highly clean substrate required by current and future technological demands, and need to be able to produce greater volumes of highly clean substrates in a shorter production time, more efficiently and consistently.

SUMMARY OF THE INVENTION

Broadly speaking, the present invention fills these needs by providing a cascade scrubber system and method that can be configured for both wafer and disk applications. The cascade scrubber system and method incorporates a series or cascade of cleaning or substrate preparation zones in a single unit that can be configured for one or more parallel operations providing a continuous and multi-substrate operation that results in cleaner and more thoroughly prepared substrates in shorter period of time. It should be appreciated that the present invention can be implemented in numerous ways, including as a process, an apparatus, a system, a device or a method. Several inventive embodiments of the present invention are described below.

In one embodiment, an apparatus for processing a disk is disclosed. The apparatus for processing a disk includes two pairs of rollers configured to prepare the disk in a vertical orientation. A track is provided that is configured to support the disk in a vertical orientation between the two pairs of rollers, and a pair of guiding rollers is provided to transition the disk in the vertical orientation along the track between the two pairs of rollers.

In another embodiment, an apparatus for processing a disk is disclosed. The apparatus for processing a disk includes two pairs of brushes oriented horizontally and arranged longitudinally from each other, and configured to receive in between the pairs of brushes a vertically oriented disk. A track is provided along the two pairs of brushes that is configured to provide a path for the vertically oriented disk to transition in a rolling movement between the pairs of brushes.

In still a further embodiment, a cascaded disk scrubbing apparatus is disclosed. The cascaded disk scrubbing apparatus includes an array of brush pairs with the array including a plurality of rows of brush pairs. Each brush pair is horizontally oriented along each row of brush pairs, and a track is also provided along each row. The track is configured to support and transition a disk in a vertical orientation between each of the brush pairs along each row.

In yet another embodiment, a method for preparing a disk is disclosed. The disk preparation method includes picking a disk from a source and placing the disk in a vertical orientation into a track. The method further provides the transitioning of the disk along the track which is configured with pairs of brushes arranged longitudinally along the track. The method further includes the scrubbing of the surfaces of the disk using each of the pairs of brushes as the disk is transitioned along the track.

The advantages of the present invention are most notably the consistent production of highly clean disks in a shorter production time. The cascade design of the present invention provides multiple scrubbing, cleaning and rinsing operations at a single station or module, thus eliminating the time and resource consuming processes of disk transfer between cleaning stations.

Another advantage of the invention is the increased volume of disks cleaned. A single line of a cascade scrubber can sequentially clean a large volume of disks in a shorter period of time by eliminating the station-to-station transfer time. The cascade scrubber, however, can be configured with multiple lines operating in parallel and yielding a significant increase in volume.

A further advantage is the consistent production of highly clean disks. The present invention provides a cascade of cleaning stations arranged in a line that progresses from "dirtier" to "cleaner" in as many or few zones as the resources and the facilities of the user allows. Further, the disks are continuously fed through the progressively cleaner, cascade scrubbing system, and the "dwell" time, or time of actual scrub, clean and/or rinse, can be increased or decreased as circumstances and needs of the user dictate.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIGS. 2A and 2B each show a single cascade scrubber assembly in accordance with two embodiments of the present invention.

FIGS. 5A–5C illustrate the process by which a substrate drive assembly is adjusted to accommodate varying sizes of substrates in accordance with one embodiment of the invention.

FIGS. 6A and 6B show multiple substrate drive assemblies configured for semiconductor wafer processing in accordance with two more embodiments of the invention.

FIGS. 6C and 6D show multiple substrate drive assemblies configured for disk preparation in accordance with two more embodiments of the invention.

FIG. 7A illustrates the function of a pick and place apparatus of the cascade scrubber system in accordance with one embodiment of the invention.

FIG. 7B shows a cross sectional view of a single pick and place apparatus adjacent to a cascade scrubber assembly in accordance with one embodiment of the invention.

FIGS. 7C-1–7C-5 illustrate several exemplary embodiments of substrate engagement devices that could be used in the processing of semiconductor wafer substrates.

FIG. 8A shows a line or "set" of pick and place apparatuses in accordance with one embodiment of the present invention.

FIG. 8B shows a detailed view of a single pick and place apparatus 163 configured for disk substrates in accordance with one embodiment of the present invention.

FIGS. 8C-1–8C-5 illustrate the process whereby the pick and place apparatus is indexed to engage and to release a disk.

FIGS. 11A and 11B provide yet another embodiment of the present invention in which a powered edge roller assembly is provided.

DETAILED DESCRIPTION OF THE PREFERRED EMBODIMENTS

As invention for substate processing equiptment, namely, scrubbing, cleaning, and rinsing, as well as buffing, etching and polishing, is disclosed. The invention can be used in the processing of substrates ranging from silicon wafers used in semiconductor manufacturing, to aluminum, ceramic, plastic, glass, composite, multi-component disks and the like used in the fabrication of data storage devices such as HDDs, CDs, DVDs and the like used in the information, computer and entertainment industries. As used herein, the term "disk" is used as all-inclusive of any of the various substates used in the media and data storage fields, and including HDDs, CDs, DVDs, mini-discs, and the like. Throughout this Detailed Description, "substate" is used in a generic sense to include both wafers and disks (also referred to as disks) and denoted 108. Substrates specified to be wafers are denoted 108', and subsrates specified to be disks are denoted 108". In the following description, numerous specific details are set forth in order to provide a throrough understanding of the present invention. It will be understood, however, to one skilled in the art, that the present invention may be practiced without some or all of these specific details. In other instances, well known process operations have not been described in detail in order not to unnecessarily obscure the present invention.

Figures 1, 7E:
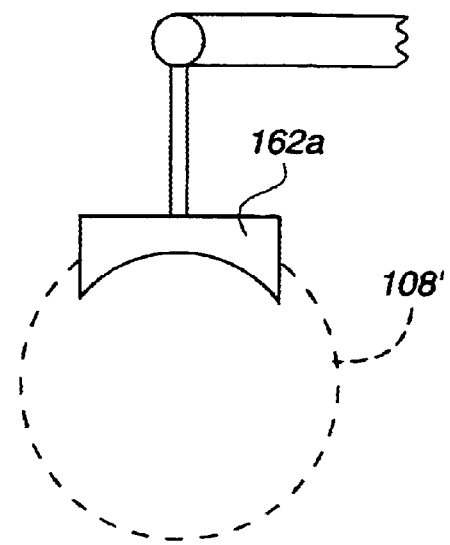
FIG. 1 shows a cascade scrubber system within a system enclosure in accordance with one embodiment of the invention.

FIG. 1 shows a cascade scrubber system 100 within a system enclosure 102 in accordance with one embodiment of the invention. In the illustrated embodiment, three lines of cascade scrubber assemblies are configured in parallel within a single system enclosure 102 to create the cascade scrubber system 100 that can be operated as a discrete cleaning system (e.g., stand alone tool), or as an integral unit or module of a larger wafer or disk preparation or fabrication system. As will be discussed below in greater detail, the embodiments of the present invention are not limited to any one type of substrate 108. Therefore, the disclosed embodiments should be read in light of equal or modified application to both semiconductor wafers and storage media such as hard disks (e.g., aluminum disks, glass disks, etc.).

The illustrated cascade scrubber system 100 employs 3 lines of cascade scrubber assemblies (see FIGS. 2A and 2B) in accordance with one embodiment of the invention. Multiple lines of cascade scrubber assemblies are configured to process substrates 108 in batches to increase throughput and efficiently utilize system resources. The three lines illustrated represent one configuration, and other embodiments can be configured with 5, 6, or as many or few lines as resource and processing needs dictate.

In FIG. 1, substrates 108 to be cleaned (shown as substrates 108a) are loaded into one of the three lines of cascade scrubbers from a substrate indexing cradle 104a. The substrate 108 is placed in the nip of a pair of rollers 110 and travels the length of the cascade scrubber assembly which consists of 5 zones in the illustrated example. As the substrate 108 travels through each zone, the processing by the pairs of rollers progressively cause the substrate 108 to become cleaner. After being processed through the scrubber assembly line, the substrate 108 is then removed from the last zone of the cascade scrubber assembly, and placed with cleaned substrates 108 (shown as substrates 108b) in a clean wafer substrate indexing cradle 104b.

FIGS. 2A and 2B each show a single cascade scrubber assembly 116, 116' in accordance with two embodiments of the present invention. In FIG. 2A, a substrate cascade scrubber assembly 116 for semiconductor wafer applications is illustrated. The wafer cascade scrubber assembly 116 provides a longitudinal scrubbing sequence divided into a series or "cascade" of zones in which a wafer 108' is progressively cleaned as it proceeds through the wafer cascade scrubber assembly 116 from one zone to the next. In each zone, a pair of rollers 110 configured with selected preparation surfaces (e.g., brushes, pads, and the like) processes the wafer 108' oriented in a vertical position. The rollers 110 are mounted on mandrels 112 and each roller 110 is configured to receive a brush, pad, or other preparation surface. By way of example, in a wafer or disk cleaning application, brushes can be used. The brushes may be made of PVA foam, or may also be urethane or other suitable material, and molded into a cylindrical foam sleeve that mounts on the roller 110. Each roller 110 contains a plurality of holes. Deionized (DI) water or other fluid is introduced under pressure into the mandrel 112 bore, so as to flow out under pressure through the roller 110 apertures and then through the brush. This helps preserve the brush life. For more information on fluid delivery techniques, reference can be made to U.S. Pat. No. 5,875,507, entitled "Wafer Cleaning Apparatus," issued Mar. 2, 1999, and U.S. Pat. No. 6,247,197 entitled "Brush Interflow Distributor," issued Jun. 19, 2001. Both U.S. Pat. No. 5,875,507 and U.S. Pat. No. 6,247,197 are incorporated herein by reference.

The mandrels 112 are configured as parallel shafts in a horizontal orientation. In one embodiment, the rollers 110 are mounted on the mandrels 112 to form the series or cascade of zones in which the scrubbing, cleaning, or other substrate preparation is accomplished. In another embodiment, the rollers 110 are mounted on the mandrels 112 to form a continuous preparation surface along the length of the mandrels 112. FIG. 2A illustrates a cascade of 5 zones, but other configurations can be utilized to accommodate the desired preparation, process application, or facility resource. Further, other embodiments of the present invention include a vertical orientation of the mandrels, or in some other angled plane, e.g., a 45-degree incline. However the mandrels 112 may be oriented, the cascade of cleaning zones progress from "dirtier" to "cleaner" as the wafer advances through the cascade scrubber assembly 116. In a vertical or inclined orientation, gravity enhances the progressive removal of particulates by the rinsing, cleaning, or other preparation fluids.

The parallel mandrel 112 pairs are configured to rotate and are attached to the cascade scrubber system 100 by conventional techniques. In one embodiment, the mandrels 112 are attached such that the spacing between the mandrels 112 is adjustable. The adjustable configuration allows for variation of pressure between the preparation surface (e.g., pad or brush) and the semiconductor wafer 108', and also allows for the use of multiple sizes of pads or brushes as dictated by the wafer 108' preparation process or disk 108" preparation process. As discussed above, the cascade scrubber assembly 116 can be used for buffing or polishing operations in addition to scrubbing and cleaning operations. The adjustable mandrels 112 allow adjustment of the preparation surface, and of the pressure applied to the substrate 108 during preparation depending on the desired process. Further, the rate of rotation of the mandrels is also adjustable.

In one embodiment, the mandrels 112 are configured to be counter-rotational. The preparation surfaces are applied with equal force on both sides of the vertically oriented wafer 108'. By way of example, brushes mounted on the rollers 110 rotate towards each other. A wafer 108' is positioned in the nip, and the rotating brushes push inwardly and downwardly on the wafer 108' equally on each side as the brushes counter-rotate inward towards the nip. At the nip, the brush rotation is downward. This pushes the wafer 108' downward onto the substrate drive track which is discussed in detail below.

FIG. 2A shows a wafer 108' in each of the multiple zones of the cascade scrubber assembly 116. The substrate drive assembly (described in detail below) transitions the wafers 108' from one zone to the next. In FIG. 2A, the transition through the cascade scrubber assembly 116 is in direction 117, and can proceed as interrupted transitions from zone to zone, or as a continuous transition from one end to the other. As will be described in greater detail below, one embodiment of the present invention incorporates a "curtain" of DI water, chemicals, or other suitable fluid between each zone. As the wafers 108' progress through the cascade scrubber assembly 116, they are progressively cleaned or otherwise prepared before being removed from between the rollers 110 that define the final zone. The use of multiple cascaded zones as well as multiple cascade scrubber assemblies 116 configured as a unit or module increases both the quality of the selected process as well as the throughput of wafers being processed.

FIG. 2B illustrates the same cascade scrubber assembly 116' as shown in FIG. 2A configured to process disks 108". In FIG. 2B, the first and last zones of the disk cascade scrubber assembly 116' are configured with a split roller 111, and associated split preparation surfaces, to accommodate the end effector used for common media disks 108". As is described in greater detail below, a disk engagement finger on a pick and place assembly attaches to the hole in the center of a disk 108". The split roller 111 shown in FIG. 2B accommodates the disk engagement finger as the disk 108" is positioned between the split rollers 111 in the first zone of the disk cascade scrubber assembly 116', and when the disk engagement finger attaches to the disk 108" to remove the disk 108" from the last zone. The remainder of the design and function of the disk cascade scrubber assembly 116' illustrated in FIG. 2B is identical to the wafer scrubber assembly 116 described in reference to FIG. 2A.

Figure 3A:
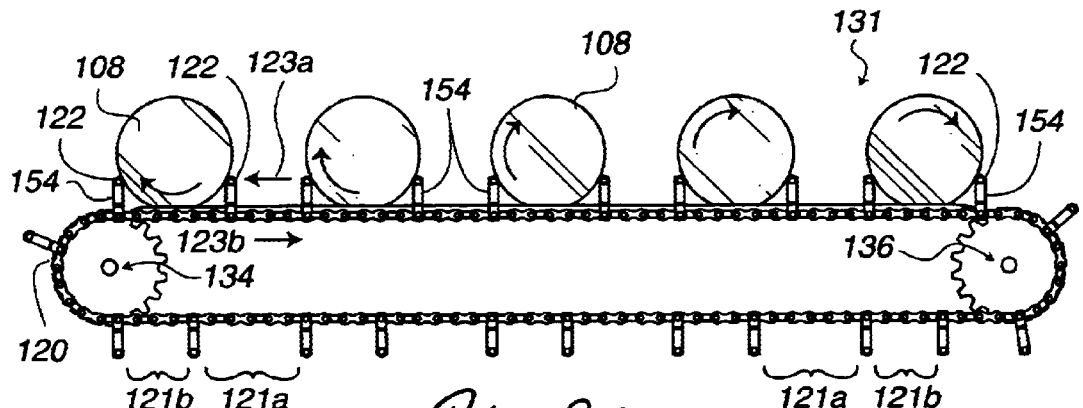
FIGS. 3A–3C illustrate components of the substrate drive assembly in accordance with one embodiment of the invention.
Figure 3B:
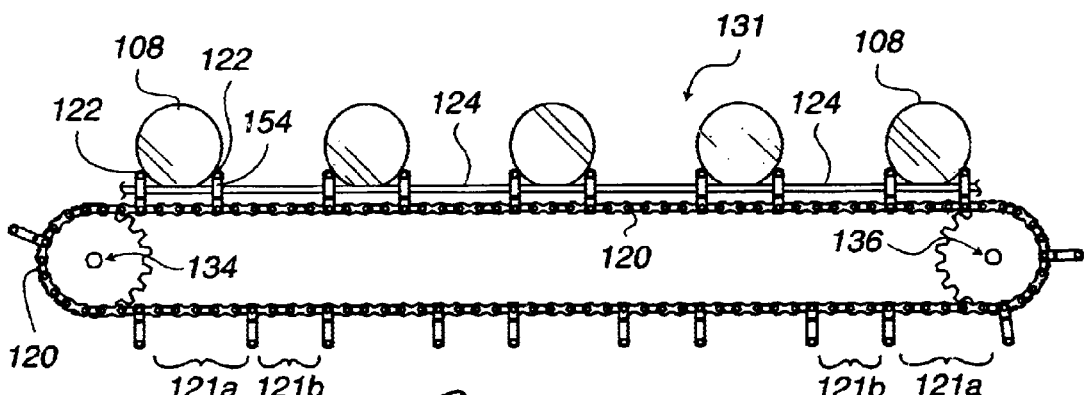
Figure 3C:
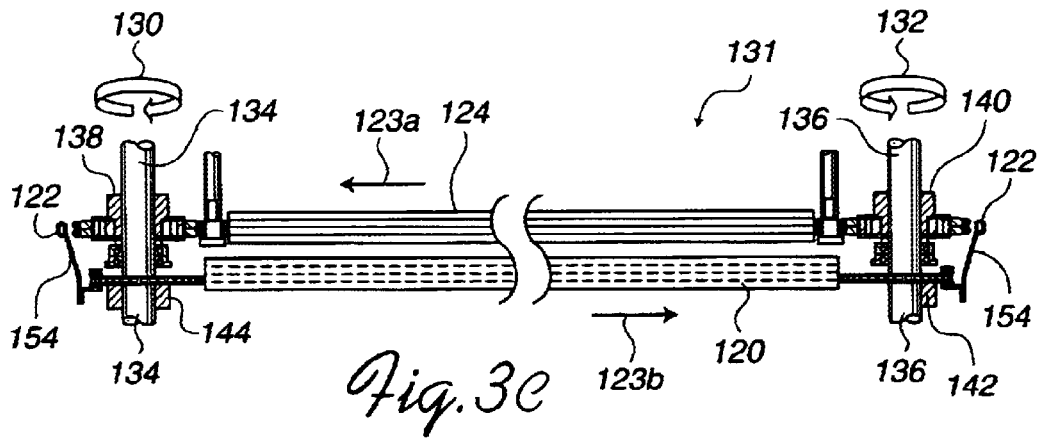

FIGS. 3A–3C illustrate components of the substrate drive assembly 131 in accordance with one embodiment of the invention. As shown in FIG. 3C, the substrate drive assembly 131 includes a roller drive chain 120, a track 124, and associated components. FIG. 3A shows a side view of a substrate drive assembly 131 with representative large substrates 108 shown. For ease of illustration, the substrates 108 used for illustration appear to be semiconductor wafer substrates 108'. It should be understood that the cascade scrubber system 100 (FIG. 1) can be adapted to both semiconductor wafer 108' and disk 108" preparation.

FIG. 3A illustrates substrates 108 in a vertical orientation and supported at two points on the edge of the substrate 108 by guiding rollers 122. The guiding rollers 122 are suspended above the substrate drive assembly 131 by guiding roller arms 154 and connected with roller arm brackets (see FIG. 4A) to the roller drive chain 120. In one embodiment, the roller drive chain 120 is an endless loop chain. The roller drive chain 120 is connected by sprockets to two parallel shafts 134 and 136, one of which drives the rotation of the roller drive chain 120. The roller drive chain 120 can be constructed of stainless steel, plastic, or other low particulate-generating materials. In another embodiment, the roller drive chain 120 is configured as a belt drive and connected to the two parallel shafts 134 and 136 by pulleys.

In one embodiment, the guiding rollers 122 are "free wheeling." The guiding rollers 122 are in contact with the substrate 108 edge and provide some lateral support, but the guiding rollers 122 freely spin on the support arms 154 and offer no resistance to the rotation of the substrate 108. The roller drive chain 120 travels in direction 123b which applies force to the substrates 108 through the guiding rollers 122 and causing the travel of the substrates 108 from one end to the other of a cascade scrubber assembly 116/116' (FIGS. 2A, 2B).

The substrates 108 are positioned on an edge rotational drive belt 124 or track (not visible in FIG. 3A) configured to support the substrates 108 in a vertical orientation between the rollers 110 (FIGS. 1, 2A, 2B). The edge rotational drive belt 124 is a track defining the path of the substrates 108 transitioning through the cascade scrubber assembly 116/116' (see FIGS. 2A, 2B) and can be an endless loop belt. The edge rotational drive belt 124 is connected to two parallel shafts 134 and 136, one of which drives the rotation of the edge rotational drive belt 124. In one embodiment, the edge rotational drive belt 124 travels in direction 123a which is opposite the direction of travel of the roller drive chain 123b. The rotation of the edge rotational drive belt 124 applies a rotational force to the substrates 108 which are positioned between pairs of guiding rollers 122. Thus, as can be seen in FIG. 3A, the substrates 108, positioned on the edge rotational drive belt 124 which is rotating in direction 123a, will be caused to rotate in a clockwise direction in their position between pairs of free wheeling guiding rollers 122. The roller drive chain 120, traveling in direction 123b, transitions the rotating substrates 108 from left to right as represented in FIG. 3A. The edge rotational drive belt (track) 124 is described in further detail in reference to FIGS. 4A and 4B.

FIG. 3B shows another embodiment of the present invention in which a smaller sized substrate 108 than that shown in FIG. 3A is being transitioned by the roller drive assembly 131. As in FIG. 3A, the substrates 108 in FIG. 3B are positioned on edge rotational drive belt 124 between free wheeling guiding rollers 122 suspended over the edge rotational drive belt 124 on guiding roller arms 154. Because the substrates 108 in FIG. 3B are smaller than those shown in FIG. 3A, the spacing of the guiding rollers is necessarily closer. In one embodiment of the present invention, the guiding roller arms 154 are configured such that the most common substrate 108 sizes can be processed by the cascade scrubber system 100 without having to change or re-configure the substrate drive assembly 131 to accommodate the different size substrates. As can be seen in FIGS. 3A and 3B, the substrates are positioned between pairs of guiding rollers 122. The guiding roller arms 154 are configured to accept a larger substrate between a wide-spaced pair of guiding arms 121a and a smaller substrate between a narrow-spaced pair of guiding arms 121b on the same roller drive chain 120. The size of the substrate 108 determines how the pairs of guiding rollers 122 are selected to support the substrate 108. For example, if the substrates 108 are wafers 108', the wafers can be 100 mm wafers, 200 mm wafers, 300 mm wafers, or any other size. If the substrates 108 are disks 108", the disks can be 3.5 inches, 2.5 inches, 1 inch, or any other size.

FIG. 3B further illustrates an embodiment in which the height of the edge rotational drive belt 124 is adjustable. Although the rollers 110 with substrate preparation surfaces are not visible in FIGS. 3A and 3B, the substrate drive assembly 131 can be configured to support the substrate 108 so that the diameter of the substrate 108 is positioned at the nip of the counter-rotating rollers 110 in one embodiment of the invention. When processing the smaller sized substrates 108, the edge rotational drive belt 124 is raised to a position to maintain the diameter of the substrate 108 in the nip of the rollers 110. Because the guiding roller support arms 154 are configured to accept large or small substrates 108 as described above, no similar adjustment to the roller drive chain 120 is required.

FIG. 3C shows an overhead view of one embodiment of the substrate drive assembly 131. In FIG. 3C, the edge rotational drive belt 124 is connected to the right rive shaft 136 by a track drive assembly 140, and is attached by a bearing 138 to the left drive shaft 134. The roller drive chain 120 is connected to the left drive shaft 134 by a roller chain drive assembly 144, and is attached by a bearing 142 to the right drive shaft 136. The configuration provides for the left drive shaft 134, turning in direction 130, to drive the roller drive chain 120 in direction 123b. The edge rotational drive belt 124, connected with a bearing 138 is not driven by the left drive shaft 134. The right drive shaft 136, turning in direction 132, drives the edge rotational drive belt 124 in direction 123a, and the roller drive chain 120, connected with a bearing 142, is not driven by the right drive shaft 136. In this embodiment, the roller drive chain 120 and the edge rotational drive belt 124 travel in opposite directions and result in a rotating substrate 108 transitioning through the cascade scrubber assembly as described above in reference to FIGS. 3A and 3B. Although FIG. 3C illustrates only a single substrate drive assembly 131, multiple drive assemblies can be configured in parallel to create a multiple-line cascade scrubber system 100 (FIG. 1) that is driven by the same two drive shafts 134, 136 as shown in FIG. 3C.

Figure 4A:
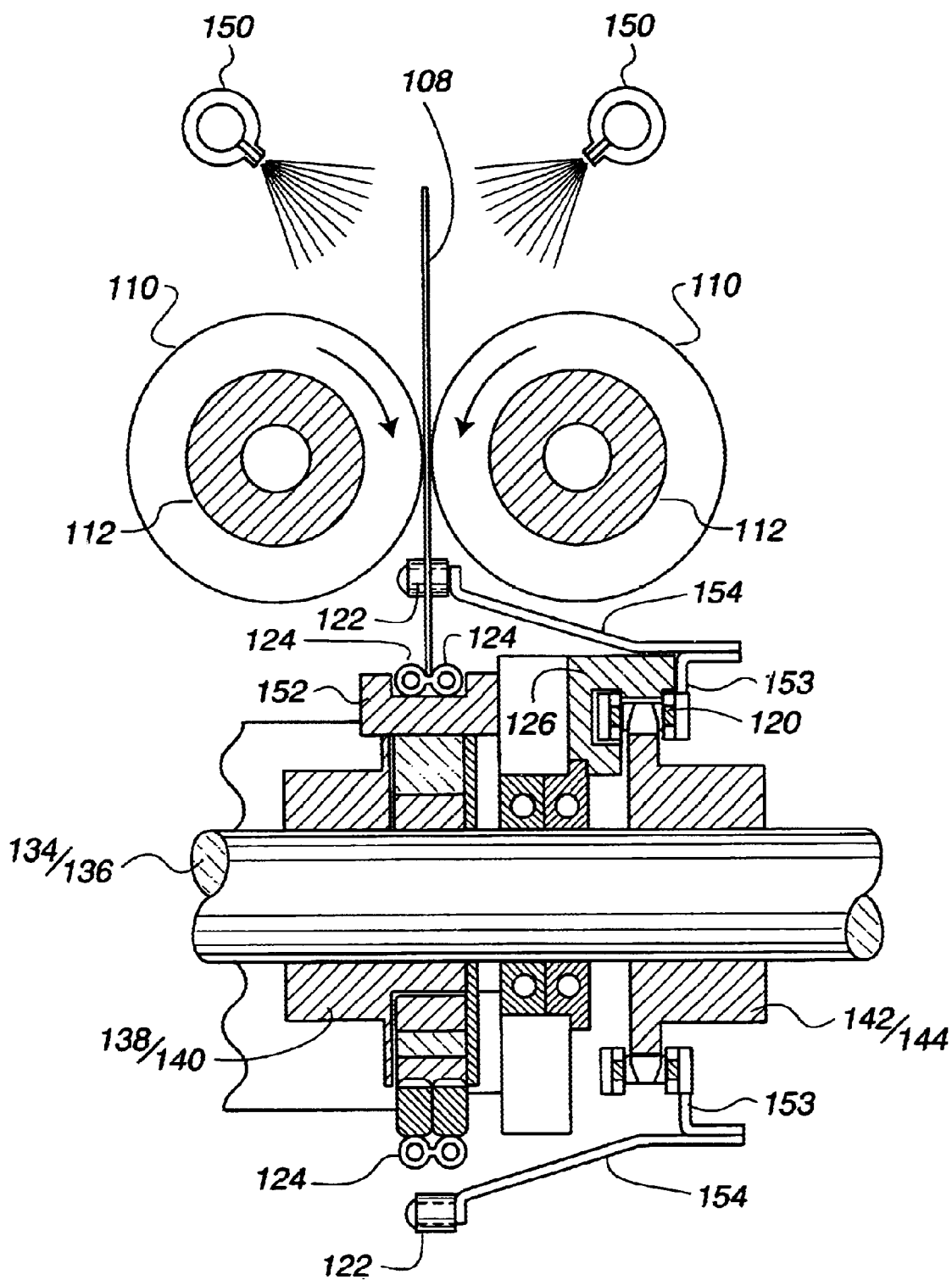
FIGS. 4A–4B show cross-sectional views of one zone of a cascade scrubber assembly, in accordance with one embodiment of the present invention.

FIG. 4A shows a cross-sectional view of one zone of a cascade scrubber assembly 116/116' (see FIGS. 2A, 2B), in accordance with one embodiment of the present invention. As discussed in detail above, a substrate 108 is positioned between two counter-rotating rollers 110 mounted on mandrels 112. The rollers 110 are covered by a substrate preparation surface such as a pad, a brush, and the like, and rotate towards each other to apply an inward and downward force equally on both sides of the substrate 108. The substrate 108 transitions through the cascade scrubber assembly 116/116' in track 124. Guide rollers 122 are suspended above the substrate drive assembly 131 (see FIGS. 3A, 3B, 3C) on guide roller arms 154 which are attached to the roller drive chain 120 by arm brackets 153. The roller drive chain 120 is isolated from the edge rotational drive belt 124, the substrate 108, and the substrate preparation region by a roller chain guard 126. The guide rollers 122 allow the substrate 108 to rotate and provide lateral support to the substrate 108 as they transition the substrate 108 along the cascade scrubber assembly 116/116' from one zone to the next driven by the roller drive chain 120.

In one embodiment, nozzles 150 are mounted above and on either side of the substrate 108. The nozzles 150 are configured to dispense fluids including DI water, chemicals, and microabrasives in suspension (e.g., slurry) depending on the desired function which can be any of buffing, polishing, scrubbing, cleaning, rinsing, and the like. In another embodiment, the nozzles 150 are configured to dispense fluids at points just above and along the nip of the brushes or other preparation surfaces on either side of the substrate 108. As discussed above in reference to FIGS. 2A and 2B, an embodiment of the present invention also provides for liquids to be dispensed through the mandrels 112, the rollers 110, and through the preparation surface. Additionally, nozzles 150 are configured in one embodiment to dispense a "curtain" of spray (e.g., chemicals or DI water) through which the substrate 108 must pass when transitioning from one zone to the next. The cascade scrubber system 100 (see FIG. 1) is designed to progress from dirtiest to cleanest as the substrates 108 transition through each zone in a cascade scrubber assembly 116/116' (see FIGS. 2A, 2B). The curtain of spray provides a final rinse as the substrate 108 exits one zone and transitions to the next, thereby maintaining the dirty to clean configuration.

Figure 4B:
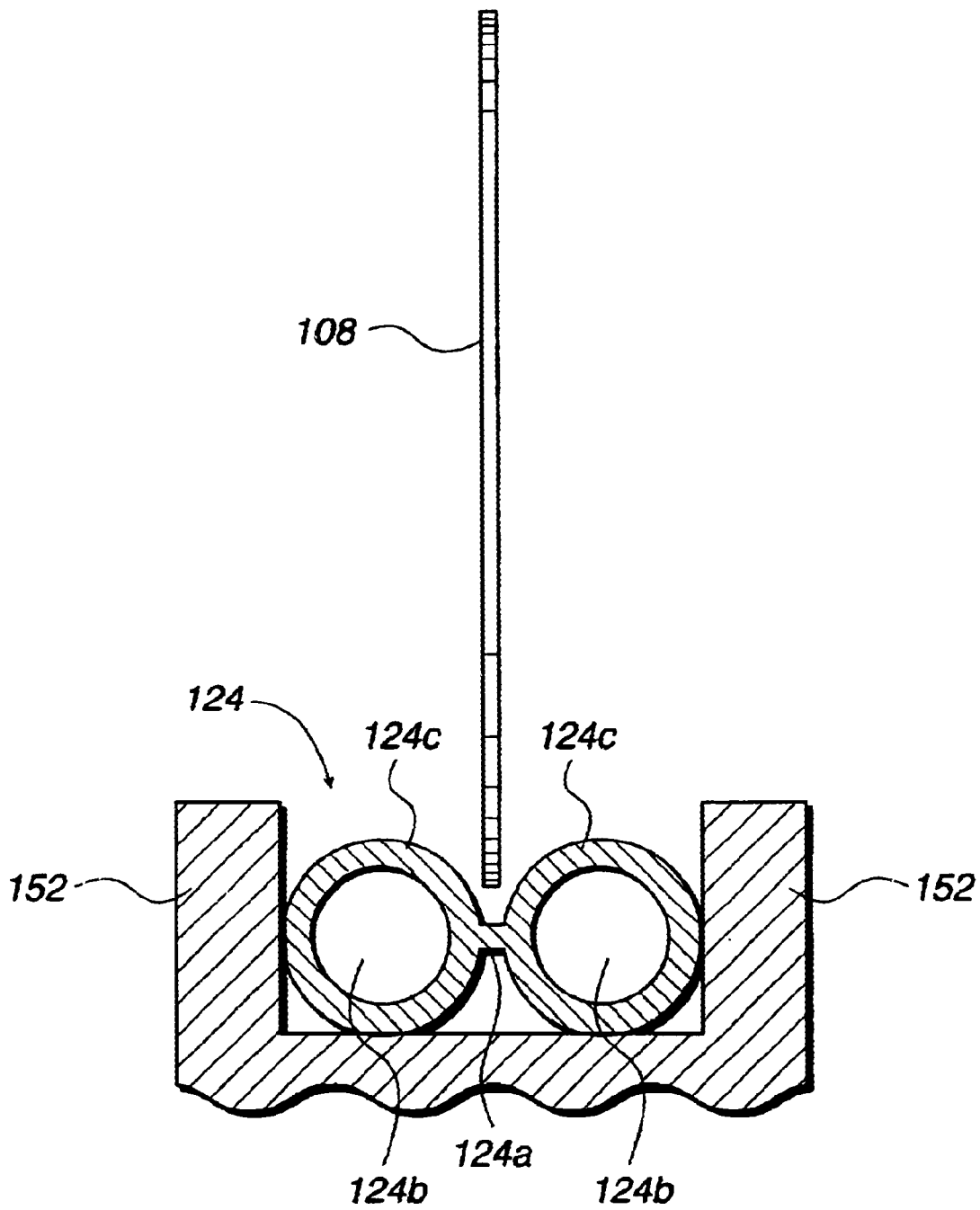

The edge rotational drive belt or track 124 travels in a track slider bed 152. FIG. 4B shows a detail view of the track 124 in accordance with one embodiment of the invention. The track 124 is constructed of two tubular structures, oriented parallel to each other and joined by a short connector section 124a. Instead of forming a sharp "V" or apex at the point of connection, the short connector section 124a forms a short bridge between the two tubular structures. Thus formed, the track 124 consists of two parallel inner hollow cores 124b, an outer surface 124c, and the short connector section 124a. The track is preferably constructed of a polymer material to provide minimum particulate generation, maximum flexibility, and superior gripping to frictionally engage the edge of the substrate 108. The track must be flexible enough to accommodate adjustment as described above with reference to FIG. 3B. Other examples of materials used in the construction of the track include rubber, polyurethane, and the like.

The track 124 travels in the track slider bed 152 and supports the substrate 108 in a vertical orientation with the edge of the substrate 108 positioned in between the two parallel tubular structures over the short connector region 124a. This provides sufficient contact region to frictionally engage the substrate 108 edge in order to apply rotation while minimizing contamination or masking from the preparation process. The track slider bed 152 is preferably constructed of plastic or polymer for minimum friction between the track 124 and the track slider bed 152. The track slider bed 152 must be of sufficient strength to maintain the position of the track 124 under the stress of both increased pressure caused by displacing the track slider bed 152 to accommodate preparation of smaller substrates 108, as well as the downward force caused by the rollers 110 during the preparation processes.

Figure 5C:
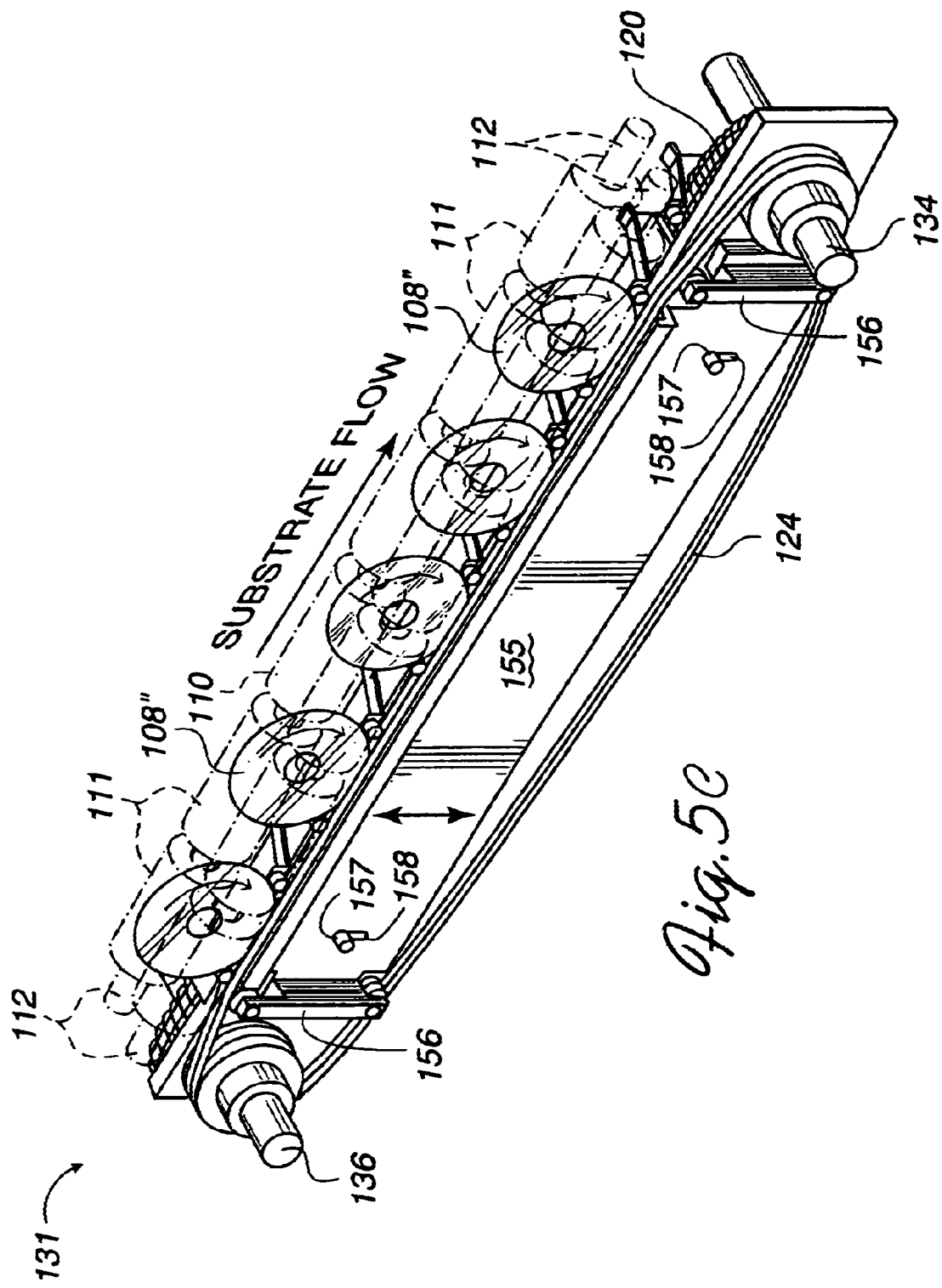

FIGS. 5A–5C illustrate the process through which a substrate drive assembly 131 is adjusted to accommodate varying sizes of substrates 108 in accordance with one embodiment of the invention. In FIG. 5A, smaller substrates 108 are shown as might be used in the preparation of media disks, or in the preparation of smaller semiconductor wafers. The substrates 108 are positioned between the closer spaced pairs of guiding rollers 122 which are suspended over the rotational drive belt or track 124 on guiding roller arms 154 which are attached to the roller drive chain 120 by arm brackets 153 (not visible in FIGS. 5A–5C). The track 124 travels in the track slider bed 152 which is mounted on a belt elevation plate 155. In one embodiment, the belt elevation plate 155 is configured to define the height of the entire length of the track 124 from the first zone to the last zone of the cascade scrubber assembly 116/116'(see FIGS. 2A, 2B). In FIG. 5A, the belt elevation plate 155 is shown in the raised position to accommodate the smaller substrates 108. The belt elevation plate is raised into position by the linked elevation idlers 156 (see FIGS. 6A–6D and accompanying discussion).

In one embodiment, height adjustment bolts 157 are loosened to allow the belt elevation plate 155 to be moved up or down up by a distance equal to the length of the height adjustment slot 158. The height adjustment bolts are then re-tightened to lock the belt elevation plate 155 in place. In another embodiment, the linked elevation idlers 156 are connected to a cam shaft that is rotated and locked into place in a raised or lowered position (see FIGS. 6A–6D and accompanying discussion). As can be seen in FIG. 5A, when the belt elevation plate 155 is in the raised position, the track slider bed 152 is in a position above the level of the pulleys by which the track 124 is connected to drives 134 and 136.

FIG. 5B shows the processing of larger substrates 108 as might be used in larger semiconductor wafers in accordance with one embodiment of the present invention. Accordingly, the substrates 108 are positioned between wider pairs of guiding rollers 122, and the belt elevation plate 155 is shown in the lowered position. In the lowered position, the track slider bed 152 is approximately level with the top of the pulleys that connect the track 124 to drives 134 and 136.

FIG. 5C shows another perspective of the substrate drive assembly with the belt elevation plate 155 in the lowered position in accordance with one embodiment of the invention. In FIG. 5C, the mandrels 112 and rollers 110 are shown in outline to illustrate an embodiment in which the belt elevation plate 155 is adjusted to maintain the substrate 108 diameter at the nip of the processing surfaces. FIG. 5C further shows another view of disk 108" processing. Accordingly, split rollers 111 are shown in the first and last zones to accommodate the disk engagement finger (see FIGS. 7A, 7B, and 8B) used to insert and remove the disk 108" from the cascade scrubber assembly 116/116' (see FIGS. 2A, 2B).

Figure 6B:
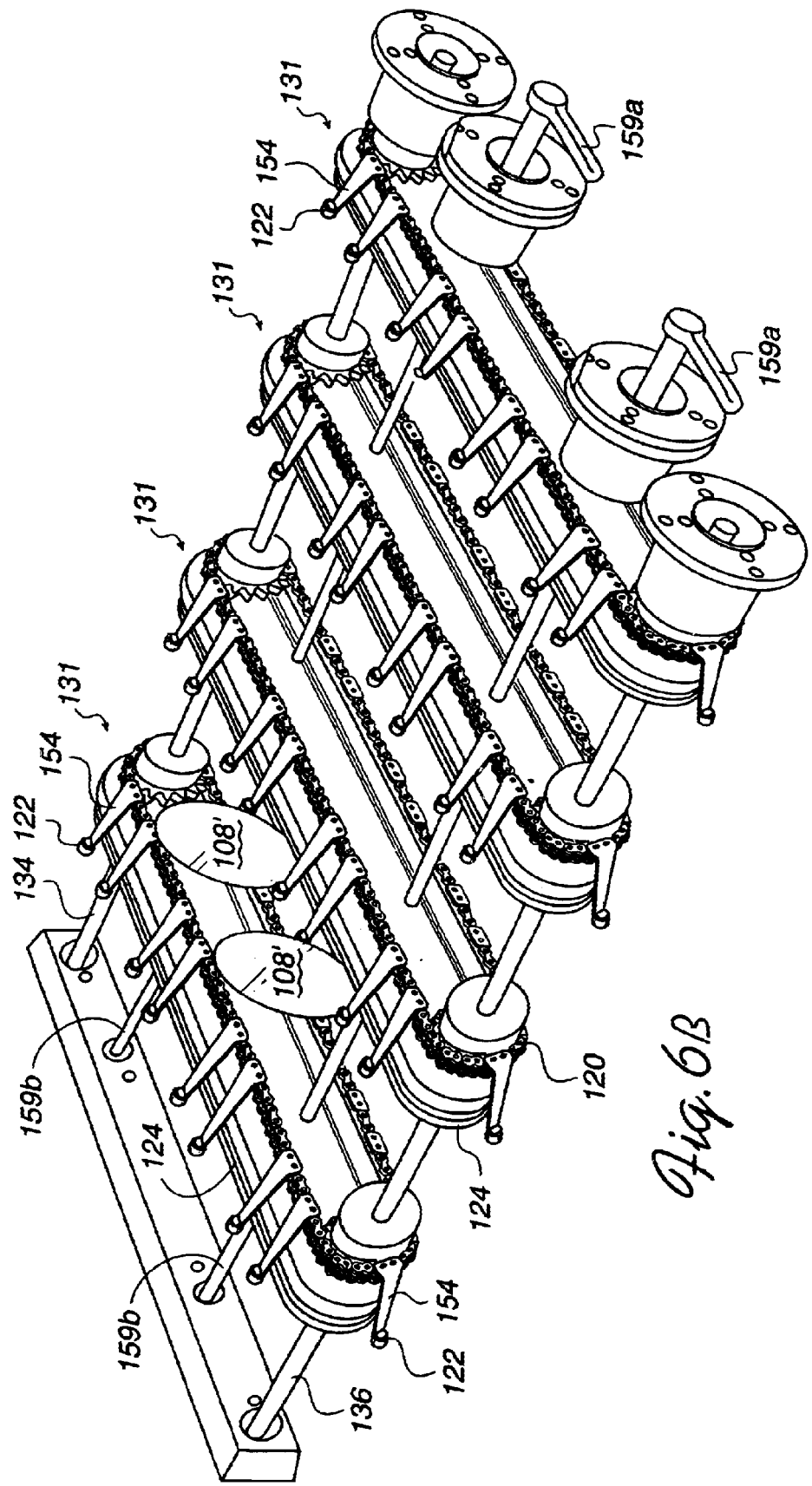

FIGS. 6A and 6B show multiple substrate drive assemblies 131 configured for semiconductor wafer processing in accordance with two more embodiments of the invention. In FIG. 6A, two substrate drive assemblies 131 are shown with two linked elevation idler levers 159a on one end. The linked elevation idler levers 159a are connected by linked elevation idler shafts 159b to the linked elevation idlers 156 (see FIGS. 5A–5C). In one embodiment of the invention, rotation of the linked elevation idler levers 159a rotates the linked elevation idler shafts 159b and the linked elevation idlers 156 positioning the belt elevation plate 155 (see FIGS. 5A–5C) in the raised or lowered position. In FIG. 6A, a large wafer 108' is positioned between a wide pair of guiding rollers 122 in track 124, and so the belt elevation plate 155 (not shown in FIG. 6A) is in the lowered position. In one embodiment, the linked elevation idler shaft 159b extends to and through as many substrate drive assemblies 131 as there may be configured, thus only one pair of linked elevation idler levers 159a is configured to each cascade scrubber system 100 (FIG. 1).

FIG. 6B shows another embodiment of multiple lines of substrate drive assemblies 131 configured for wafer processing. In FIG. 6B, four lines of substrate drive assemblies 131 are configured in one system. As in FIG. 6A, two linked elevation idler shafts 159b controlled by two linked elevation idler levers 159a control the positioning of all four belt elevation plates 155 (not shown in FIG. 6B). Large wafers 108' are shown in position between pairs of wide spaced guiding rollers 122 in track 124. As illustrated in FIGS. 6A and 6B, the guiding rollers 122 are positioned over track 124 on guiding roller arms 154 which are attached to the roller drive chain 120 by arm brackets 153. The guiding rollers 122 provide some lateral support to the wafers 108' positioned in track 124, and primarily guide the wafers 108' along the track 124 as they transition the cascade scrubber assembly 116 (see FIG. 2A) in the direction and at the rate of the movement of the roller drive train 120. The primary support maintaining the wafers 108' in the vertical orientation is provided by the rollers 110 (not shown in FIGS. 6A and 6B). As discussed in detail above in reference to FIGS. 3A–3C, in one embodiment, the track 124 moves in the opposite direction of the roller drive chain 120 and imparts a rotational force on the wafers 108'. Thus, the wafers 108' rotate as they transition the cascade scrubber assembly 116 ensuring complete and thorough surface preparation.

Figure 6D:
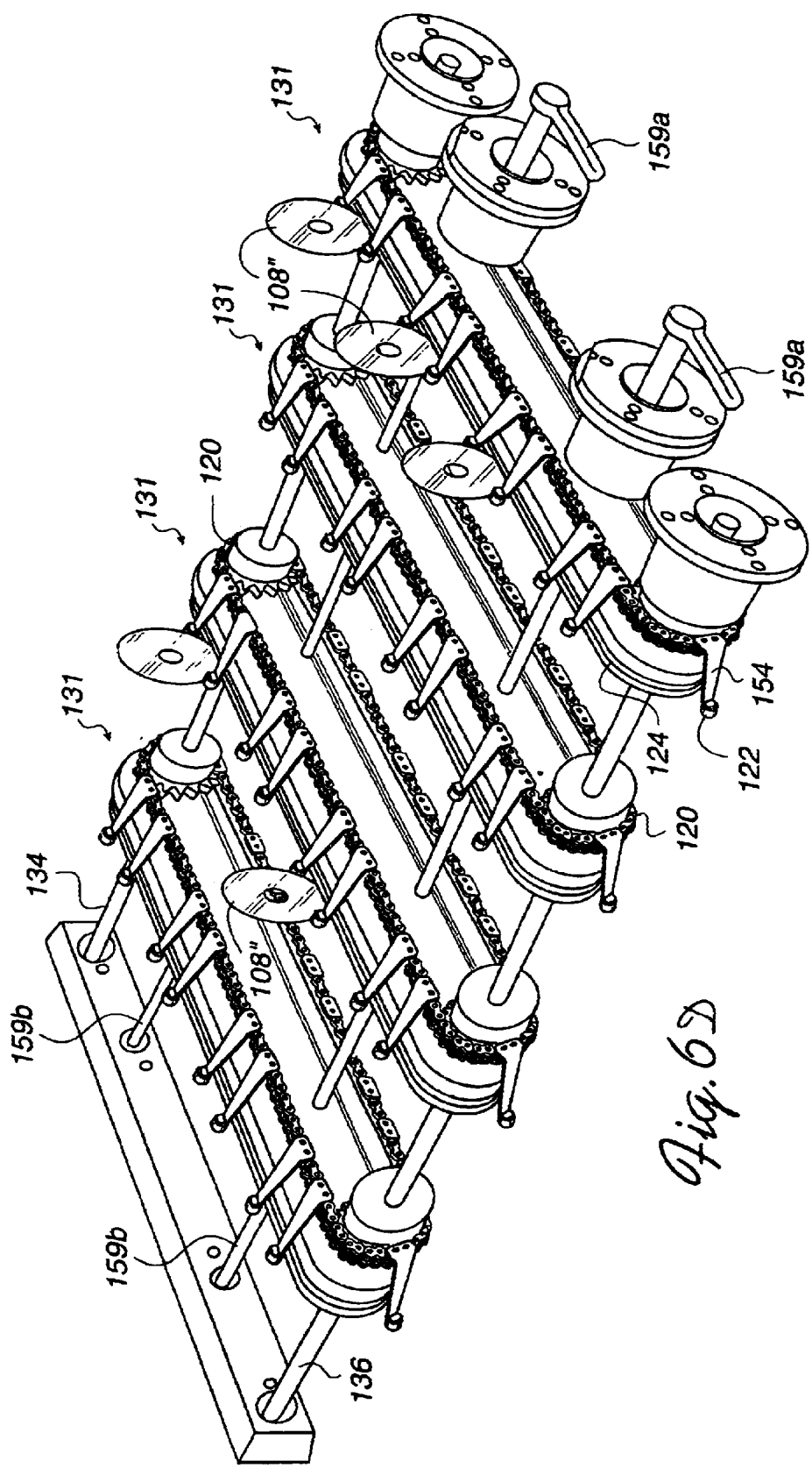

FIGS. 6C and 6D show the embodiments discussed above in reference to FIGS. 6A and 6B that have been configured for disk 108" preparation. In FIGS. 6C and 6D, disks 108" are positioned in the substrate drive assemblies 131. Because of the smaller size of a disk 108''', they are positioned between pairs of narrow spaced guiding rollers 122 in track 124. As discussed above in reference to FIGS. 3A–3B, and 5A–5B, the narrow spaced guiding rollers 122 ensure proper positioning of the disk 108" in the track 124 for smooth transitioning through the cascade scrubber assembly 116' (see FIG. 2B), and maintain the disk 108" diameter at the nip or roller 110 (not shown in FIGS. 6C and 6D) centerline for the most effective disk 108" preparation.

7A illustrates the function of a pick and place apparatus 163 of the cascade scrubber system 100 (see FIG. 1) in accordance with one embodiment of the invention. FIG. 7A shows a side view of a single cascade scrubber assembly 116/116' with pick and place assemblies 163 positioned to insert and remove substrates 108. Substrates 108 (illustrated in FIG. 7A as disks 108") are positioned next to the cascade scrubber system 100 in a substrate carrier 160. In one embodiment, the substrates 108 are positioned in a holding tank 165 outside of the cascade scrubber system 100 in a substrate carrier 160. In one embodiment, the holding tank 165 is an immersion tank in which the substrates 108 are kept immersed in DI water or some other fluid. In another embodiment, the holding tank 165 is a wet tank in which nozzles 150 are mounted which are used to keep the substrates 108 sprayed with DI water or some other fluid.

The substrate carrier 160 is mounted on a substrate elevation mechanism 161. In one embodiment, substrates 108 are transported to the cascade scrubber system 100 (see FIG. 1) following some processing operation. As described above, the cascade scrubber system 100 can be configured as a discrete, stand alone tool, or it can be configured as a modular unit of a larger substrate processing system. Depending on the configuration of the cascade scrubber system 100, large quantities of substrates 108 can be batched for processing in a single "run". The immersion or wet holding tank 165 maintains the proper surface condition of a substrate 108 for the most effective processing by the cascade scrubber system 100. In one embodiment, the substrates 108 are transported in a batch to the holding tank 165 by a wafer transport mechanism 190 which is further described in reference to FIG. 9. The substrate carrier 160 is attached to a substrate elevation mechanism 161 which is positioned under the substrates in the wafer transport mechanism 190 and configured to receive the batch of substrates 108 and position them inside of the holding tank 165.

In one embodiment, there are two pick and place apparatuses 163 for each "line" or cascade scrubber assembly 116/116'. One pick and place apparatus 163 is used to insert a substrate 108 into the first zone of the cascade scrubber assembly 116/116', and one pick and place apparatus 163 is used to remove a substrate 108 from the last zone of the cascade scrubber assembly 116/116'. In one embodiment, the pick and place apparatus 163 includes a pick and place arm 164 mounted on an indexing base 167. Attached to the pick and place arm 164 is a disk engagement finger extension 166, and attached to the disk engagement finger extension 166 is one of several embodiments of disk engagement finger 162. In another embodiment, the disk engagement finger 162 attaches directly to the pick and place arm 164. The disk engagement finger 162 engages the substrate 108 in such a manner as to remove the substrate 108 from the substrate carrier 160 and place the substrate 108 in the first zone of a cascade scrubber assembly 116/116', and to remove the substrate 108 from the final zone of a cascade scrubber assembly 116/116' and place the substrate 108 in a clean substrate carrier 160. Several embodiments of disk engagement fingers are discussed in greater detail below with reference to FIGS. 7C-1–7C-5, 8B, and 8C-1–8C-5.

In FIG. 7A, an embodiment of the pick and place apparatus 163 used for processing disks 108" with a center aperture is illustrated. As shown, the disk engagement finger 162 engages the center aperture of a disk 108" stacked in a substrate carrier 160 and positioned in a holding tank 165. The disk engagement finger extension 166 is attached to the pick and place arm 164 on a pivot, and the pick and place arm 164 is also attached to the indexing base 167 on a pivot so that as the pick and place arm 164 pivots in an arc from the horizontal up and through the vertical and to the opposite horizontal, the disk 108" is lifted off of the substrate carrier 160, out of the holding tank 165, and transported to the first zone of the cascade scrubber assembly 116/116'. The embodiment of the cascade scrubber assembly 116/116' illustrated in FIG. 7A is configured with 4 zones. The first and last zones, zones 1 and 4, are configured with split rollers 111 to accommodate the embodiment of disk engagement finger 162 that engages a substrate 108 in a center aperture (e.g., a disk 108"). In another embodiment, the disk engagement finger 162 engages a substrate 108 on a top edge as when the substrate 108 is a wafer 108' (e.g., see FIG. 7C-1) and rollers 110 are used in all zones of the cascade scrubber assembly 116/116'.

When a disk 108" is placed between the split rollers 111 in the first zone of the cascade scrubber assembly 116/116', the disk engagement finger 162 must be indexed to release or disengage the disk 108". This is also necessary to engage or pick up a disk 108" from the substrate carrier 160. In one embodiment, the indexing base 167 is configured to index or displace the pick and place apparatus 163 a sufficient distance to insert or remove the disk engagement finger 162 into or from the center aperture of the disk 108". This index distance is illustrated as distance 168 in FIG. 7B.

Returning to FIG. 7A, once the disk 108" has been placed in between the split rollers 111 in the first zone of the cascade scrubber assembly 116/116', and the disk engagement finger 162 has been disengaged from the center aperture of the disk 108", the pick and place arm 164 arcs back to the holding tank 165 for the next disk 108". In one embodiment, the indexing base 167 indexes the pick and place apparatus 163 to align with the next disk 108" in the substrate carrier 162, and then indexes back to the insertion point between the split rollers 111 in the first zone of the cascade scrubber assembly 116/116'. In another embodiment, the indexing base 167 indexes the pick and place apparatus 163 only enough to allow the disk engagement finger 162 to engage and disengage the disk 108". In this embodiment, the substrate elevation mechanism 161 indexes the substrate carrier 160 in order to align the next disk 108" to be processed with the pick and place apparatus 163. In still another embodiment, the substrate elevation mechanism 161 places the substrate carrier 160 on a carrier indexing mechanism (not shown) that performs the necessary indexing to align each disk 108" with the pick and place apparatus 163.

A pick and place apparatus 163 removes disks 108" from the final zone of the cascade scrubber assembly 116/116' in much the same manner as disks 108" are inserted in the first zone. In FIG. 7A, after a disk 108" is processed in zone 4, the pick and place apparatus 163 extends the disk engaging finger 162 into the split rollers 111 and engages the disk 108". The pick and place arm 164 arcs from the cascade scrubber assembly 116/116' to the clean holding tank 165 where it deposits the clean disk 108" in a clean substrate carrier 160. In one embodiment of a cascade scrubber system 100, a disk 108" is placed in the first zone as a disk 108" is being removed from the last zone. While another disk 108" is being removed from a substrate carrier 160 in the holding tank 165 to be inserted in the cascade scrubber system 100 (see FIG. 1), a clean disk 108", having been processed in the cascade scrubber system 100, is placed in a clean substrate carrier 160 in a clean holding tank 165. This process continues until a batch of disks 108" is processed. A cascade scrubber system 100 configured with multiple lines of cascade scrubber assemblies 116/116' in parallel can significantly decrease total processing time for volumes of substrates 108, as well as increasing the amount of time an individual substrate 108 is processed. In one embodiment, a cascade scrubber configured with four lines of 5 zones will process approximately 2000 substrates per hour with each substrate receiving approximately 20 seconds of total scrub or other process time. This represents a significant improvement over prior art achieving throughput of only approximately 500 substrates per hour and 10 seconds of total scrub or other process time.

Figures 2, 7E:
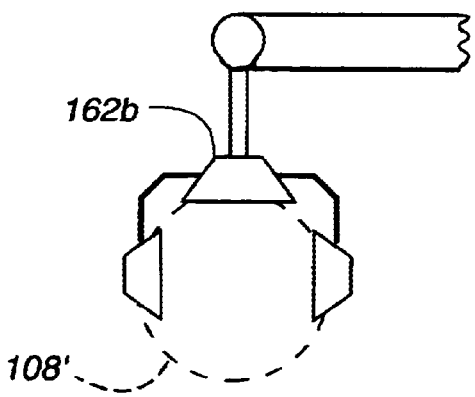
Figures 3, 7E:
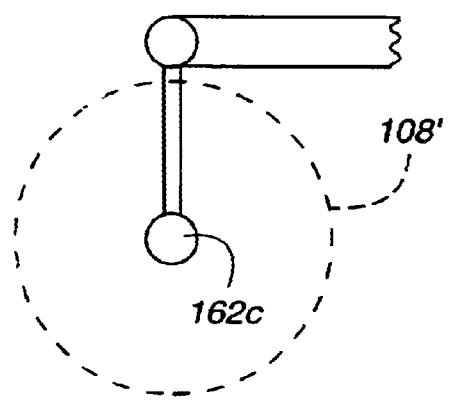
Figures 4, 7E:
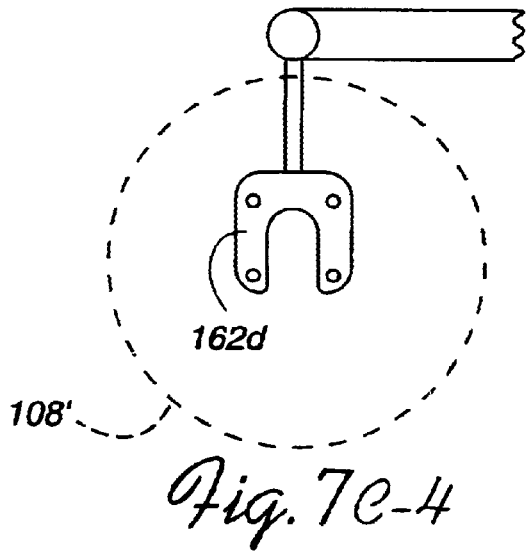
Figures 5, 7E:
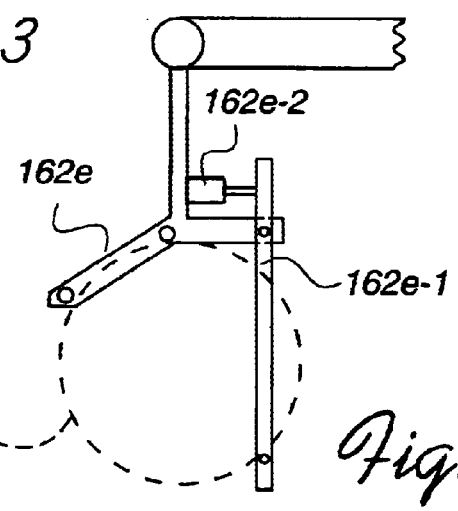

FIGS. 7C-1–7C-5 illustrate several exemplary embodiments of substrate engagement devices that could be used in the processing of semiconductor wafer substrates 108'. Since semiconductor wafers 108' don't have a center aperture as does the media disk 108", the disk engagement finger 162 for semiconductor wafers 108' is an end effector or similar device. FIG. 7C-1 shows an embodiment that uses a vacuum edge holder 162a that can be used for smaller sized semiconductor wafers 108'. FIG. 7C-2 is a variation of the vacuum edge holder configured as a 3-point vacuum edge holder 162b that is more effective for larger sized wafers 108'. FIG. 7C-3 is an embodiment of an end effector using center point vacuum or suction 162c, and FIG. 7C-4 is a variation of the center point vacuum or suction that has multiple vacuum or suction points 162d. FIG. 7C-5 shows a 3-point edge holder 162e. The 3-point edge holder 162e resembles an inverted "Y" that establishes 2 points of edge contact near the top of the wafer 108'. A pivoting arm 162e-1 controlled by an actuator 162e-2 establishes the third point of edge contact near the bottom of the wafer 108'. FIGS. 7C-1–7C-5 are only exemplary embodiments of substrate engagement devices used when the cascade scrubber system 100 (see FIG. 1) is configured to process semiconductor wafers 108'.

FIG. 8A shows a line or "set" of pick and place apparatuses 163 in accordance with one embodiment of the present invention. As illustrated, one embodiment is configured with 4 lines of cascade scrubber assemblies 116/116'(see FIGS. 2A, 2B). Each cascade scrubber assembly 116/116' is fed by a pick and place apparatus 163. The pick and place apparatuses 163 are connected by a common swing shaft 181 about which each pick and place arm 164 arcs, and each pick and place apparatus 163 is attached to a common arm indexer assembly 180. The arm indexer assembly 180 provides a single common base that indexes the pick and place arms as described above for parallel operation. Thus, in one embodiment, the pick and place apparatuses simultaneously pick substrates 108 from the substrate carrier (not shown) and place the substrates 108 in the first zone of their corresponding cascade scrubber assembly 116/116'. FIG. 8A illustrates an embodiment configured to process disks 108", and the illustrated portion of the cascade scrubber assembly 116/116' is configured with a split roller 111 in the first and last zones. As substrates 108 are placed in the cascade scrubber assembly 116/116' for processing, the arm indexer assembly 180 indexes the entire set in index direction 182 to pick the next substrates 108 and to place the substrates 108 in their corresponding cascade scrubber assemblies 116/116'.

FIG. 8A also illustrates the mandrel hub assembly 184 in accordance with one embodiment of the invention. As described above in reference to FIGS. 2A and 2B, the mandrels 112 can be configured for adjustment in an embodiment of the invention. FIG. 8A illustrates a mandrel hub assembly 184 in which both the spacing between the mandrels 112 in a pair is adjustable (G and G') as well as the vertical position of the mandrel 112 pairs above the substrate drive assembly 131 (not shown) is adjustable (F). As described above, one embodiment of the present invention can accommodate different sized substrates 108 by adjustment (F) of the mandrel 112 pairs. One embodiment can employ off-center substrate 108 processing which can be accomplished by vertical adjustment (F) of the mandrel 112 pairs. In another embodiment, the substrates 108 can be inserted and removed from between the rollers 110 by adjusting the spacing (G, G') between the mandrel 112 pairs to allow the disk engaging finger 162 to engage the substrate 108. In a further embodiment, the rollers 110 can be equipped with different sized processing surfaces, or the rollers 110 themselves can be of varying sizes which can be accomplished by adjusting the spacing (G, G') between the mandrel 112 pairs.

FIG. 8B shows a detailed view of a single pick and place apparatus 163 configured for disk substrates 108" in accordance with one embodiment of the present invention. As described above in reference to FIG. 7A, a pick and place arm 164 is attached to an indexing base 167 on a pivot allowing rotation through at least 180 degrees from one horizontal to the opposing horizontal. The disk engagement finger extension 166 is connected to the pick and place arm 164 also on a pivot thus allowing the disk engagement finger 162 carrying the substrate 108 to be maintained in a constant orientation through the arc of the pick and place arm. The disk engagement finger 162 is attached to the disk engagement finger extension 166 to engage the substrate (e.g., disk 108"). In the illustrated embodiment, the disk engagement finger 162 is configured to engage a disk 108" through the center aperture. In one embodiment, the disk engagement finger 162 is positioned to allow it to enter the center aperture on a disk 108". The pick and place apparatus 163 then indexes a distance 168 so that the outer lip of the disk engagement finger 162 is all the way through the center aperture in the disk 108". When the pick and place arm is raised at the beginning of its arc, the disk engagement finger 162 captures the disk 108" in the center aperture. The pivot connection of the disk engagement finger extension 166 to the pick and place arm 164 maintains the orientation of the disk engagement finger 162 so that the disk 108" remains in the slot of the disk engagement finger 162 and thus engaged from pick to place. When the disk 108" is placed in the first zone of the cascade scrubber assembly 116/116'(see FIGS. 2A, 2B), the disk engagement finger 162 is lowered enough for the lip to clear the center aperture in the disk 108". The indexing base 167 then indexes the pick and place arm 164 the distance 168 to completely disengage the disk engagement finger 162 from the disk 108" before arcing over to pick another disk 108".

FIGS. 8C-1–8C-5 illustrate another embodiment of disk engagement finger 162. FIGS. 8C-1–8C-5 further illustrate the process described above whereby the pick and place apparatus 163 is indexed to engage and to release a disk 108". In FIG. 8C-1, the disk engagement finger extension 166 with an embodiment of disk engagement finger 162 attached that is configured for use with disks 108", is lowered to a position in which the disk engagement finger 162 can be inserted into the center aperture of the disk 108". In FIG. 8C-2, the disk engagement finger 162 is indexed into the center aperture of the disk 108". As the disk engagement finger 162 is raised in FIG. 8C-3 to begin its arc to place the disk 108" in a cascade scrubber assembly 116/116'(see FIG. 7A), the disk 108" settles securely into the disk engagement finger 162. FIG. 8C-4 illustrates the constant orientation of the disk 108" and disk engagement finger 162 as the disk 108" is transitioned to placement.

In FIG. 8C-5, the disk 108" is placed between split rollers 111 in the first zone of a cascade scrubber assembly 116/116' (see FIG. 7A). The disk engagement finger 162 and the disk engagement finger extension 166 are inserted in the slot of the split rollers 111 (see FIGS. 2B, 7A and 8A), and the disk 108" is inserted into the nip of the opposing split rollers 111 configured with some preparation surface (e.g., brush, pad, etc.). After the disk 108" is positioned on the track 124 and against the guiding rollers 122, the disk engagement finger 162 continues movement in a downward direction until the entire disk engagement finger 162 can be removed from the center aperture in the disk 108". The pick and place apparatus 163 is then indexed to withdraw the disk engagement finger 162 from the center aperture of the disk 108". The disk engagement finger 162 and the disk engagement finger extension 166 transition out of the slot in the split rollers 111 as the pick and place arm arcs to pick another disk 108".

Figure 9:
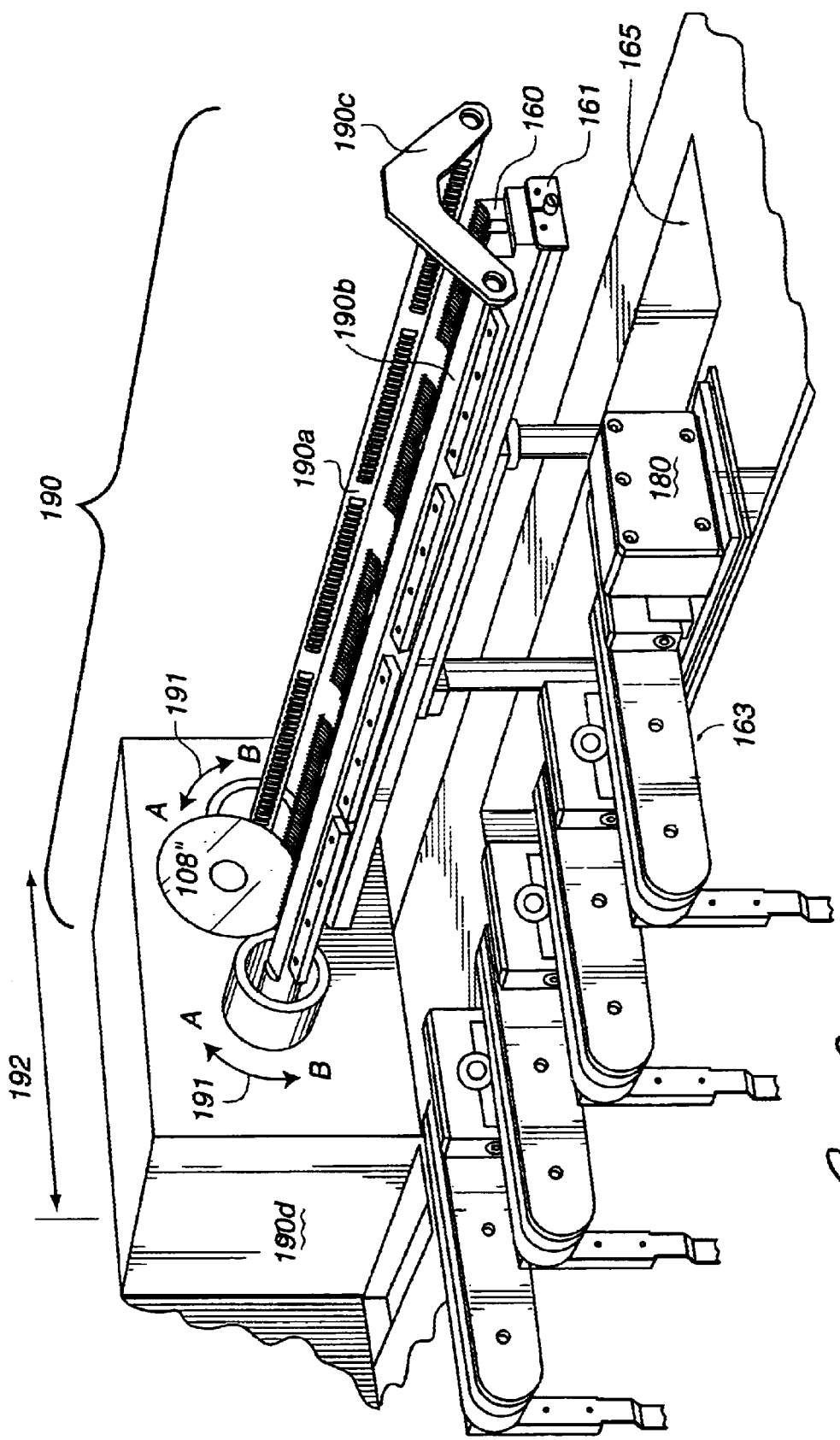
FIG. 9 illustrates a substrate transport mechanism in accordance with one embodiment of the invention.

FIG. 9 illustrates a substate transport mechanism 190 in accordance with one embodiment of the invention. The substrate transport mechanism 190 includes right and left arms 190a, 190b, joined at a pivot connector 190c, and mounted to transport base 190d. As illustrated in FIG. 9, the substrate transport mechanism 190 is positioned over holding tank 165 adjacent to a set of pick and place apparatuses 163 attached to a common arm indexer assembly 180. Extending out of the holding tank 165 and up to the substrate transport mechanism 190 is a substrate elevation mechanism 161 on which is mounted a substrate carrier 160.

In one embodiment, the substrate transport mechanism 190 transfers batches of substrates 108 to a cascade scrubber system 100 (see FIG. 1) for batch processing. In FIG. 9, the substrate transport mechanism 190 can transport one hundred substrates 108 to a cascade scrubber system 100 that includes four cascade scrubber assemblies 116/116' (not shown in FIG. 9) as indicated by the illustrated four pick and place apparatuses 163. Substrates 108 are positioned in the substrate transport mechanism 190 in slots configured in the right and left arms 190a, 190b. A representative disk 108" is shown in FIG. 9 to illustrate the position of a substrate 108 in the substrate transport mechanism 190. Right and left arms 190a, 190b are configured to counter-rotate to effect the engaging and releasing of substrates 108. When moving from an engaged position to a release position, the right and left arms 190a, 190b could simultaneously pivot in opposite directions turning the slots away from the substrates. By way of example, in FIG. 9 both right and left arms 190a, 190b could pivot in direction "B" as noted in directional arrows 191 to move from engaged to release. The direction is reversed to move from release to engaged (e.g., direction "A" in directional arrows 191). In one embodiment, both right and left arms 190a, 190b are mounted in journal bearings in pivot connector 190c, and to motor driven, rotating mountings in the transport base 190d.

In one embodiment, the substrate transport mechanism 190 is positioned over a batch of substrates 108 disposed in a substrate carrier 160. The substrate carrier 160 could be as shown in FIG. 9 mounted on a substrate elevation mechanism 161, or could be a substrate 108 cradle, cassette, and the like, configured to hold batches of substrates 108 positioned to be engaged by the right and left arms 190a, 190b of a substrate transport mechanism 190. In the embodiment illustrated in FIG. 9, the substrate elevation mechanism 161 lifts the substrate carrier 160 filled with substrates 108 to a position between the right and left arms 190a, 190b of the wafer transport mechanism 190. As the substrates 108 are lifted into position, the right and left arms 190a, 190b are in a disengaged position allowing the substrates 108 to be positioned in between the right and left arms 190a, 190b. Once the substrates 108 are in position, the right and left arms 190a, 190b simultaneously rotate in opposite directions (e.g., in direction "A" of arrows 191) positioning the slots on the right and left arms 190a, 190b under the substrates 108. As the substrate elevation mechanism 161 lowers, the substrates 108 remain supported by the right and left arms 190a, 190b, and the substrate elevation mechanism 161 with the attached, and now empty, substrate carrier 160 lowers clear of the substrate transport mechanism 190.

The substrate transport mechanism 190 can be configured to move laterally as indicated by directional arrow 192. With a batch of substrates 108 supported by the right and left arms 190a, 190b, the transport base 190d is configured to transport substrates 108 between processing and preparation modules or tools. In one embodiment, when the substrate transport mechanism 190 arrives at a next processing station with a batch of substrates 108, a substrate elevation mechanism 161 lifts an empty substrate carrier [161] 160 under the substrates and between the right and left arms 190a, 190b. When the right and left arms 190a, 190b transition from engaged to release (e.g., direction "B" on arrows 191), the support of the substrates is transferred from the right and left arms 190a, 190b to the substrate carrier 160. The substrate elevation mechanism 161 can then lower the substrate carrier 160 with a batch of substrates 108 clear of the wafer transport mechanism 190 and, in FIG. 9, into a holding tank 165. The substrates 108 can then be transitioned into the cascade scrubber system 100 (see FIG. 1) for processing as described above in reference to FIG. 7A.

Figure 10A:
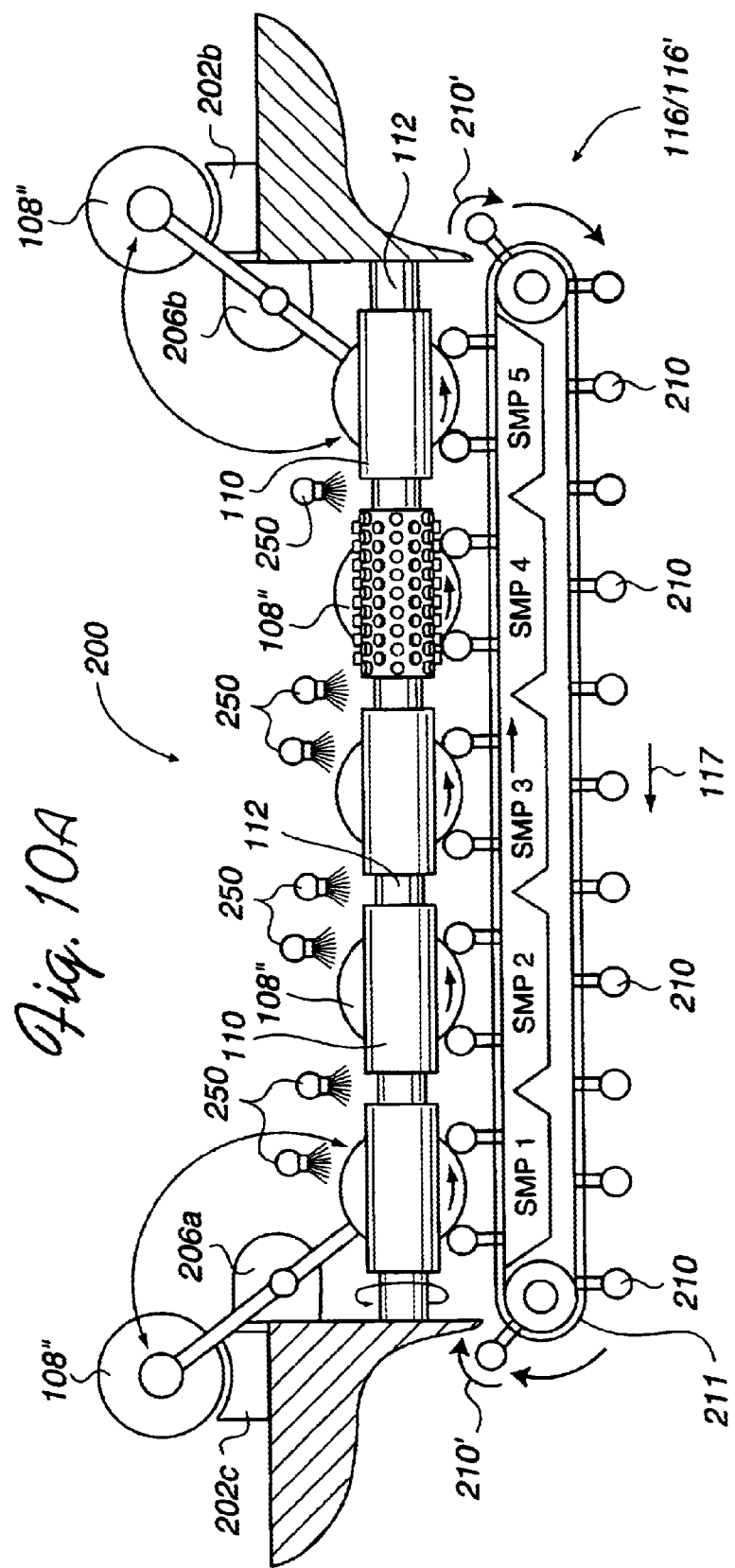
FIG. 10A shows an alternative cascade scrubbing system, in accordance with one embodiment of the present invention.

FIG. 10A shows an alternative cascade scrubbing system 200, in accordance with one embodiment of the present invention. The alternative cascade scrubbing system 200 is shown in a cross-sectional view to illustrate how a plurality of rollers 110 are arranged along a mandrel 112. As mentioned previously, the rollers 110 are covered with a preparation surface and are configured to scrub or prepare substrates 108 as they progress along the plurality of rollers 110 from one zone to the next along the cascade scrubber assembly 116/116' (see FIG. 7A). In this embodiment, a pick-and-place robot 206a is configured to pick a disk 108" from an indexer 202c, and then place the disk 108" between the first pair of rollers 110. As shown, the pick-and-place robot 206a will rotate about an axis and is configured to index to the proper location of the indexer 202c, and then swing in an arc to place the disk 108" between the first pair of rollers 110 in the first zone of the cascade scrubber assembly 116/116'.

Once the pick-and-place robot 206a places the disk 108" in the proper location, the disk 108" will be engaged between a pair of rotating edge wheels 210. The rotating edge wheels 210 are attached to a belt 211. As shown, the belt 211 will be rotating in a clockwise direction such that the rotating edge wheels 210 will move a disk 108" from a dirty side at one end of the cascade scrubber assembly 116/116' to a clean side on the other end of the cascade scrubber assembly 116/116'. At the same time, the rotating edge wheels 210 are configured to have a wheel rotation direction 210'. The wheel rotation direction 210' is also configured to be in a clockwise direction. The clockwise direction of the rotating edge wheels 210 are configured to cause a disk 108" to rotate in a counter clockwise direction as it transitions through the cascade scrubber assembly 116/116'. Accordingly, each disk 108" that is loaded into the alternative cascade scrubbing system 200 will be scrubbed between each pair of rollers 110 as it progresses through the cascade scrubber assembly 116/116'.

Also shown in FIG. 10A is a plurality of sumps (SMP 1–SMP 5). The plurality of sumps are arranged such that there is one sump for each zone, and each sump is directly below a pair of rollers 110. In a preferred embodiment, each sump is configured to drain into a previous sump such that fluids being applied and coming off of the rollers 110 and disk 108" will flow into a previous sump. For example, fluids draining from the final zone of the cascade scrubber assembly 116/116' will flow into the previous sump (i.e., SMP 4). The drain of fluids from the SMP 4 will then drain into SMP 3, and the fluids of SMP 2 will flow into SMP 1 before being drained out of the system. The sumps therefore are configured to enable dirtier fluids to migrate to the beginning of the cascade scrubber assembly 116/116' and maintaining the desired dirty to clean configuration of the alternative cascade scrubbing system 200.

Figure 10B:
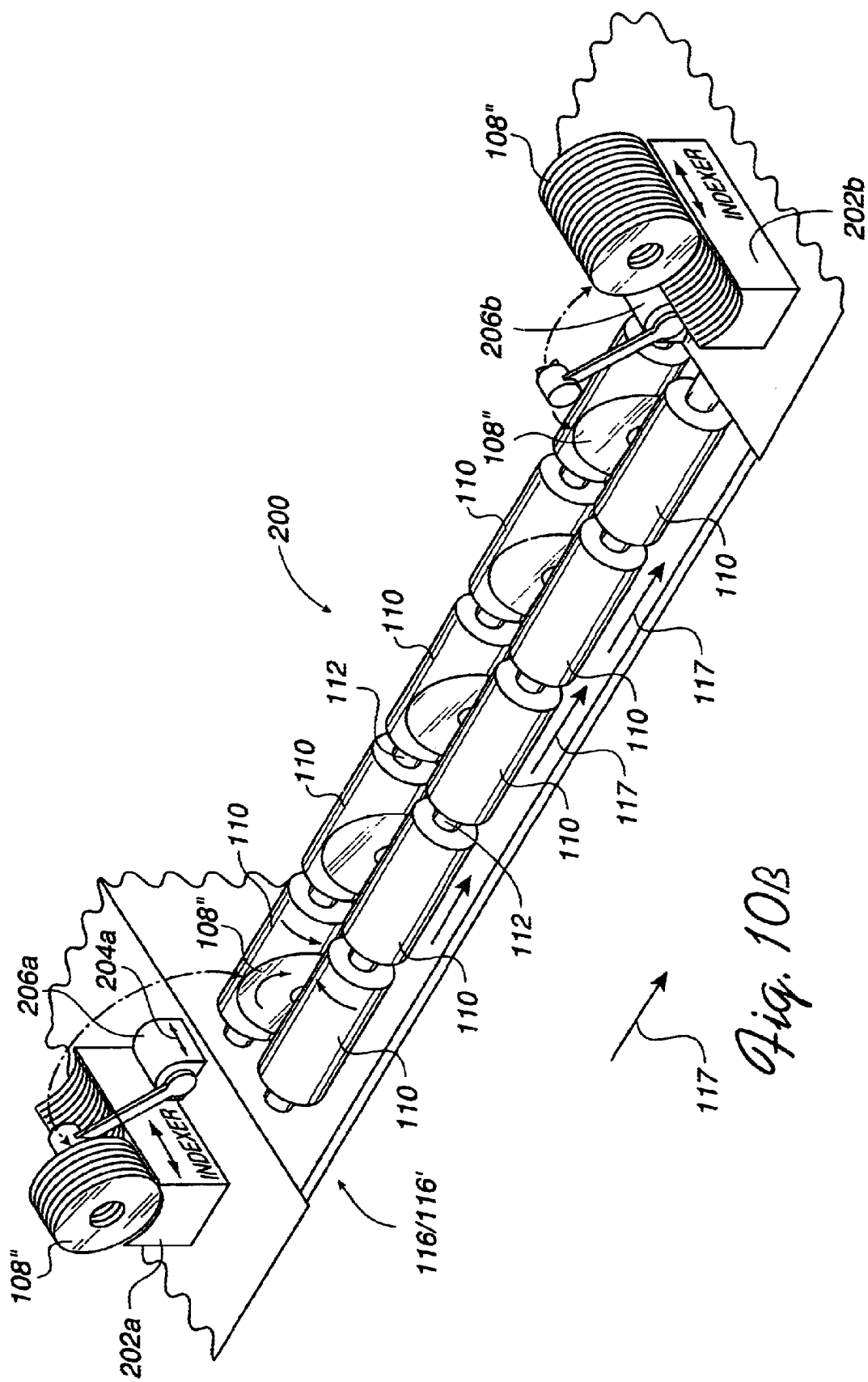
FIG. 10B shows a three-dimensional view of the alternative cascade scrubbing system.

FIG. 10B shows a three-dimensional view of the alternative cascade scrubbing system 200. From this view, the indexer 202a is shown including a plurality of disks 108". Also shown is an indexer 202b having a plurality of disks 108" which have been scrubbed through the alternative cascade scrubbing system 200. The pick-and-place robot 206a is configured to also index in a direction shown as 204a to enable an edge of the pick-and-place robot 206a to engage a particular disk 108". The indexers 202a and 202b are also configured to move such that the pick-and-place robot 206a and 206b can access the correct disk 208 and either pick or place the disk 108" from the indexer 202a or in the indexer 202b. Once the pick-and-place robot 206a places the disk 108" between the rollers 110 of the first zone, the disk 108" will be engaged on the rotating edge wheels 210 as shown in FIG. 10A. Thus, the disk 108" will transition through each zone until it reaches the final zone of the cascade scrubber assembly 116/116'. After the disk 108" has been processed by the last set of rollers 110, the pick-and-place robot 206b removes the disk 108" from between the rollers 110 and places the clean disk 108" into the appropriate location in the indexer 202b.

FIGS. 11A and 11B provide yet another embodiment of the present invention in which a powered edge roller assembly 300 and 300' is provided. In FIG. 11A, the powered edge roller assembly 300 is shown having a looped drive belt 304 which is caused to rotate around pulleys 308. The looped drive belt 304 is shown moving in a looped drive belt direction 305. Also shown is a roller drive chain 302a which is configured to drive edge rollers 302 in a direction 117. The roller drive chain 302a is configured to be driven by a sprocket 309 which will be rotated in a clockwise direction, in this embodiment. As the roller drive chain 302a rotates in the clockwise direction, the looped drive belt 304 will move in a counterclockwise direction as shown by the looped drive belt direction 305. As shown, the looped drive belt 304 will be in frictional contact with the edge rollers 302, thus causing the edge rollers to rotate in a clockwise direction as the edge rollers 302 move physically in direction 117. As a result, the wafers 108' will move in direction 117 while also rotating in a counterclockwise direction.

FIG. 11B shows yet another embodiment 300' of the powered edge roller assembly of FIG. 11A. In this embodiment, idlers 308c are provided along with a group of four sprockets 309 and pulleys 308a. The sprockets 309 and pulleys 308a are designed to be at four corners of the powered edge roller assembly 300'. The idlers 308c are configured to be at about a center region between the four pulleys 308a and sprockets 309. In a preferred embodiment, the powered edge roller assembly 300' is configured to move the looped drive belt 304 as well as the roller drive chain 302a in a downward or upward direction depending upon desired fabrication operations. For instance, if off-center buffing is desired for the wafers 108' being prepared through the powered edge roller assembly 300', the idlers 308c can be configured to either move up or down until a desired buffing profile is applied to the surfaces of the wafers 108'. As shown, the wafers 108' travel in the direction 117 while being buffed or scrubbed in different regions of the wafer 108' surface. For reference purposes only, a brush line is shown where the brushes can be arranged along the direction of travel of the power edge roller assembly 300'. Although referred to as a brush line, the line can also be the line through which the substrates 108 travel when being buffed by a suitable buffing material attached to rollers as described above. Accordingly, it should be understood that the present invention can be modified to provide the appropriate processing for either wafers 108' or disks 108" and achieve those results along a cascaded arrangement for improved throughput and processing efficiency.

Figure 12:
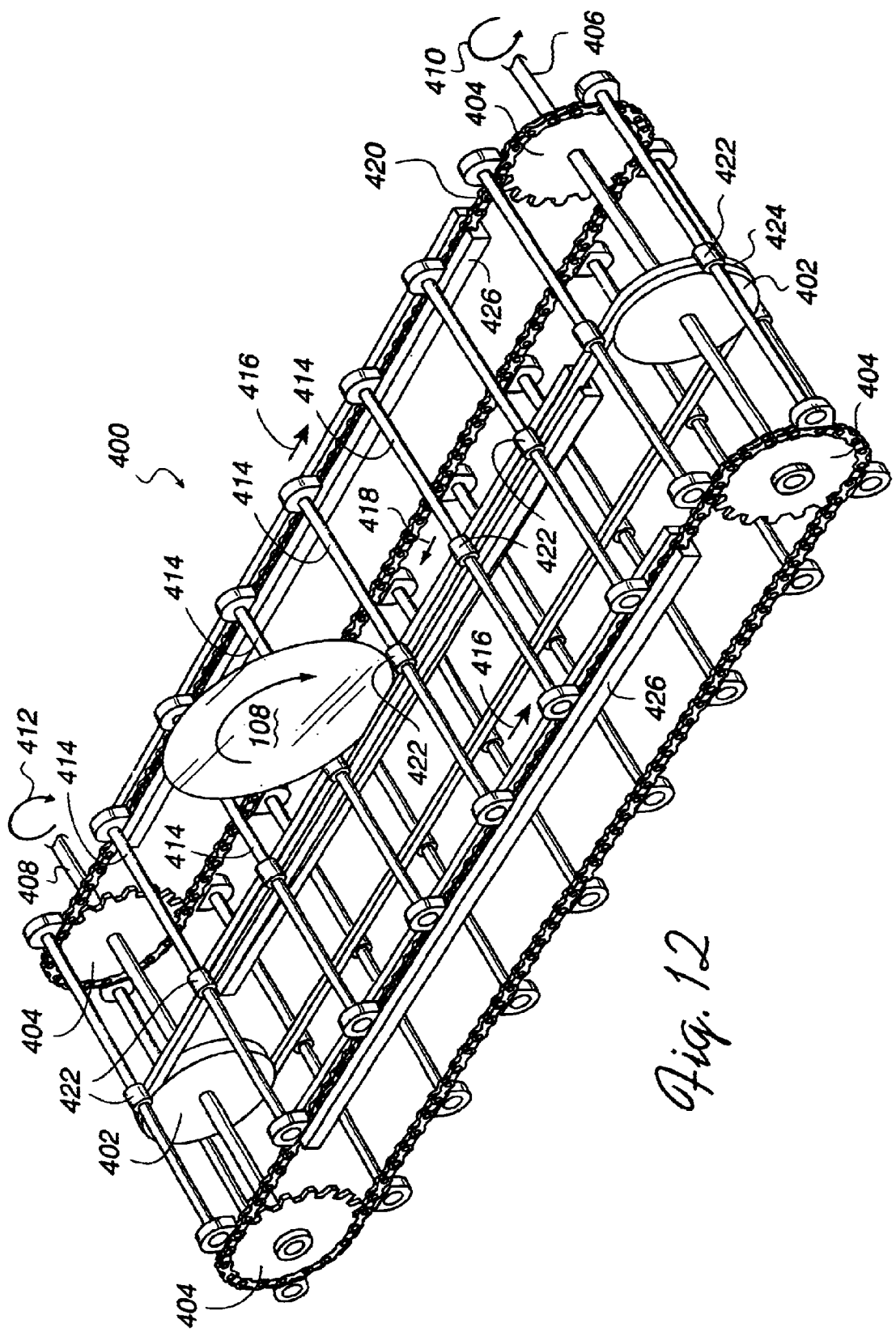
FIG. 12 shows yet another embodiment of the invention and an alternative substrate drive assembly.

FIG. 12 shows yet another embodiment of the invention and an alternative substrate drive assembly 400. The alternative substrate drive assembly 400 includes a center substrate track 424 in which a substrate 108 transitions through the alternative substrate drive assembly 400. Edge guide rollers 422 are attached to the center of a plurality of rods 414 and positioned over the center substrate track 424. The plurality of rods 414 span a parallel pair of drive chain 420 loops, and are attached to the drive chains 420. The upper portion of the drive chains 420 travel in open ended, upwardly facing drive chain guide channels 426. The position of the drive chain drive channels 426 determines the height above the track 424 of the edge guide rollers 422, and in one embodiment can be adjusted to accommodate different sized substrates 108. In another embodiment, the height of the drive chain guide channels 426 can be adjusted to permit off-center scrubbing.

The drive chains 420 are driven by sprockets 404. In FIG. 12, the sprockets 404 are driven by shaft 408 which is turning in direction 412. Sprockets 404 on shaft 406 are attached with bearings so shaft 406 turning in direction 410 does not drive the sprockets 404. Thus, in FIG. 12, the drive chains 420 are driven in direction 416 and the plurality of rods 414 with the attached edge guide rollers 422 travel in direction 416. A substrate 108 is positioned between a pair of edge guide rollers 422 and transitions through the alternative substrate drive assembly 400 in direction 416.

The substrate 108 is positioned in track 424. Track 424 is attached to shafts 406 and 408 by pulleys 402. Shaft 406$m$ turning in direction 410, drives pulley 402 and track 424 in direction 418. Pulley 402 attaches to shaft 408 with a bearing and is thus not driven by shaft 408. Track 424, traveling in direction 418, imparts a rotational force on substrate 108 so that substrate 108 rotates clockwise at it transitions through the alternative substrate drive assembly 400 in direction 416.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for processing a disk, comprising:
    a first pair of rollers configured for preparing the disk in a vertical orientation;
    a second pair of rollers configured for preparing the disk in a vertical orientation;
    a track configured to support the disk in the vertical orientation between the first pair of rollers and the second pair of rollers; and
    a pair of guiding rollers configured to transition the disk along the track from the first pair of rollers to the second pair of rollers,
    wherein each of the first pair of rollers and the second pair of rollers includes a first roller and a second roller, each first roller and second roller being oriented side by side and configured to rotate, an axis of rotation for each first and second roller being oriented parallel to a direction of movement along which the disk travels when transitioning along the track from the first pair of rollers to the second pair of rollers.

2. An apparatus for processing a disk as recited in claim 1, wherein a rotation of each first roller is in an opposite direction of a rotation of each second roller and each of the first pair of rollers and the second pair of rollers is configured to prepare the disk disposed between each first roller and each second roller.

3. An apparatus for processing a disk as recited in claim 2, wherein the first pair of rollers and the second pair of rollers are oriented longitudinally.

4. An apparatus for processing a disk as recited in claim 3 wherein the first pair of rollers and the second pair of rollers are configured to prepare the disk with a brush, the brush defining an outer surface of the first pair of rollers and the second pair of rollers.

5. An apparatus for processing a disk as recited in claim 4 wherein the brushes are polyvinyl alcohol (PVA).

6. An apparatus for processing a disk as recited in claim 5 wherein the first pair of rollers and the second pair of rollers and the brushes are configured to dispense fluids for the processing of the disk.

7. An apparatus for processing a disk as recited in claim 6 further comprising:
    first spray nozzles directed at the first pair of rollers;
    second spray nozzles directed at the second pair of rollers; and
    third spray nozzles directed at a region between the first pair of rollers and the second pair of rollers;
    wherein each of the first, second and third spray nozzles are configured to dispense fluids for the processing of the disk.

8. An apparatus for processing a disk as recited in claim 2, further comprising:
    a first pick and place mechanism configured to position a disk between the first roller and the second roller of the first pair of rollers; and
    a second pick and place mechanism configured to remove a disk from between the first roller and the second roller of the second pair of rollers.

9. An apparatus for processing a disk as recited in claim 8, wherein the first pick and place mechanism and the second pick and place mechanism are configured to move in an indexed manner to align with a disk to be processed and to align between the first roller and the second roller of one of the first pair of rollers and the second pair of rollers.

10. An apparatus for processing a disk as recited in claim 8, wherein the first pick and place mechanism and the second pick and place mechanism are configured to hold and manipulate the disk being of any size with a disk engagement finger.

11. An apparatus for processing a disk as recited in claim 1, wherein the track supporting the disk in the vertical orientation between the first pair of rollers and the second pair of rollers is further configured to apply a rotation to the disk.

12. An apparatus for processing a disk as recited in claim 11, wherein the track is adjustable to position the disk in the vertical orientation between the first pair of rollers and between the second pair of rollers such that an approximate center of the disk is aligned with an approximate center of the first pair of rollers and with an approximate center of the second pair of rollers.

13. An apparatus for processing a disk as recited in claim 1, wherein the track is flexible and is adjustable to be positioned in one of a number of vertical levels to enable preparation of different sized disks.

14. An apparatus for processing a disk as recited in claim 1, wherein the track is constructed of a composite material and formed of at least two tubular structures joined in a center region in which the disk is positioned and supported in the vertical orientation.

15. An apparatus for processing a disk as recited in claim 1, wherein the track is disposed within an open-ended bed that is configured to allow movement of the track within the apparatus for processing the disk.

16. An apparatus for processing a disk as recited in claim 1, wherein the track is configured to move in a first direction and the pair of guiding rollers is configured to move in a second direction which is opposite the first direction.

17. An apparatus for processing a disk as recited in claim 1, wherein the pair of guiding rollers is further configured to apply rotation to the disk.

18. An apparatus for processing a disk, comprising:
    a first pair of brushes oriented horizontally and configured to receive a vertically oriented disk therebetween;

a second pair of brushes oriented horizontally and disposed longitudinally relative to the first pair of brushes, the second pair of brushes being further configured to receive the vertically oriented disk therebetween;

a track being disposed longitudinally along the first pair of brushes and the second pair of brushes, the track being configured to provide a path for the vertically oriented disk to transition in a rolling motion between the first pair of brushes and the second pair of brushes, and the track being capable of movement in a track direction of travel; and at least one pair of guiding rollers disposed over the track and being spaced apart to receive a disk therebetween, the at least one pair of guiding rollers being capable of movement in a guide roller direction of travel which is opposite the track direction of travel.

19. An apparatus for processing a disk as recited in claim 18, wherein the first pair of brushes and the second pair of brushes are polyvinyl alcohol (PVA).

20. An apparatus for processing a disk as recited in claim 18, wherein the first pair of brushes and the second pair of brushes are configured to dispense fluids for the processing of the disk.

21. An apparatus for processing a disk as recited in claim 18, further comprising:

first spray nozzles directed at the first pair of brushes;

second spray nozzles directed at the second pair of brushes; and third spray nozzles directed at a region between the first pair of brushes and the second pair of brushes;

wherein each of the first, second and third spray nozzles are configured to dispense fluids for the processing of the disk.

22. An apparatus for processing a disk as recited in claim 18, further comprising:

a first pick and place mechanism configured to position the disk between a first brush and a second brush of the first pair of brushes; and a second pick and place mechanism configured to remove the disk from between a first brush and a second brush of the second pair of brushes.

23. An apparatus for processing a disk as recited in claim 22, wherein the first pick and place mechanism and the second pick and place mechanism are configured to move in an indexed manner to align with a disk to be processed and to align between the first brush and the second brush of one of the first pair of brushes and the second pair of brushes.

24. An apparatus for processing a disk as recited in claim 22, wherein the first pick and place mechanism and the second pick and place mechanism are configured to hold and manipulate the disk being of any size with a disk engagement finger.

25. An apparatus for processing a disk as recited in claim 18, wherein the track is flexible and is adjustable to be positioned in one of a number of vertical levels to enable preparation of different sized disks.

26. An apparatus for processing a disk as recited in claim 18, wherein the track is constructed of a composite material and formed of at least two tubular structures joined in a center region in which the disk is positioned and supported in the vertical orientation.

27. A cascaded disk scrubbing apparatus, comprising:

an array of brush pairs, the array including, a plurality of rows, each row including a plurality of counter-rotating brush pairs, each counter-rotating brush pair being horizontally oriented along the plurality of counter-rotating brush pairs;

a plurality of tracks for vertically supporting and transitioning a disk in a vertical orientation between each of the plurality of counter-rotating brush pairs along each row;

a plurality of pairs of free-wheeling guiding rollers disposed over each track of the plurality of tracks, each pair of the plurality of pairs of free-wheeling guiding rollers being spaced apart to receive a disk therebetween, wherein each track of the plurality of tracks is capable of movement in a first direction and each pair of free-wheeling guiding rollers of the plurality of pairs of free-wheeling guiding rollers is capable of movement in a second direction which is opposite the first direction.

28. A cascaded disk scrubbing apparatus as recited in claim 27, wherein each brush pair is configured to dispense fluids.

29. A cascaded disk scrubbing apparatus as recited in claim 27, further comprising a first plurality of spray nozzles directed at each brush in the plurality of brush pairs and a second plurality of spray nozzles directed at a region between each of the plurality of brush pairs along each row including a plurality of brush pairs, wherein the first plurality of spray nozzles and the second plurality of spray nozzles are configured to dispense fluids.

30. A cascaded disk scrubbing apparatus as recited in claim 27, further comprising:

a first pick and place mechanism configured to position the disk between a first brush pair of each row including a plurality of brush pairs; and a second pick and place mechanism configured to remove the disk from between a last brush pair of each row including a plurality of brush pairs.

31. A cascaded disk scrubbing apparatus as recited in claim 30, wherein the first pick and place mechanism and the second pick and place mechanism are configured to move in an indexed manner to align with a disk to be processed and to align between one of the first brush pair and the last brush pair.

32. A cascaded disk scrubbing apparatus as recited in claim 30, wherein the first pick and place mechanism and the second pick and place mechanism are configured to hold and manipulate the disk being of any size with a disk engagement finger.

33. A cascaded disk scrubbing apparatus as recited in claim 27, wherein each track of the plurality of tracks is flexible and is adjustable to be positioned in one of a number of vertical levels to enable preparation of different sized disks.

34. A cascaded disk scrubbing apparatus as recited in claim 27, wherein each track of the plurality of tracks is constructed of a composite material and formed of at least two tubular structures joined in a center region in which the disk is positioned and supported in the vertical orientation.

* * * * *